United States Patent [19]

Sasama et al.

[11] Patent Number: 5,555,397
[45] Date of Patent: Sep. 10, 1996

[54] PRIORITY ENCODER APPLICABLE TO LARGE CAPACITY CONTENT ADDRESSABLE MEMORY

[75] Inventors: Hiroshi Sasama; Masato Yoneda, both of Tokyo, Japan

[73] Assignee: Kawasaki Steel Corporation, Hyogo, Japan

[21] Appl. No.: 2,463

[22] Filed: Jan. 7, 1993

[30] Foreign Application Priority Data

Jan. 10, 1992 [JP] Japan .................................. 4-003404
Jan. 10, 1992 [JP] Japan .................................. 4-003405

[51] Int. Cl.⁶ .................................................... G06F 7/00
[52] U.S. Cl. ........................... 395/485; 395/732; 395/435; 364/259.1; 364/259.9; 364/DIG. 1
[58] Field of Search .................................... 395/725, 485, 395/732, 435; 364/715.1, 715.01; 365/49; 341/160; 340/825.51

[56] References Cited

U.S. PATENT DOCUMENTS

| | | | |
|---|---|---|---|
| 3,928,789 | 12/1975 | Elias | 361/193 |
| 4,293,849 | 10/1981 | Lacy | 340/365 S |
| 4,879,561 | 11/1989 | Inkol | 342/195 |
| 4,887,084 | 12/1989 | Yamaguchi | 341/160 |
| 5,036,486 | 7/1991 | Noguchi et al. | 365/49 |
| 5,123,105 | 6/1992 | Wyland et al. | 395/725 |
| 5,321,640 | 6/1994 | Anderson et al. | 364/715.1 |

FOREIGN PATENT DOCUMENTS 2-47038  10/1990  Japan ............................. G11C 15/04

OTHER PUBLICATIONS

"Design of CMOS VLSI", edited by Tetsuya Iizuka and supervised by Takuo Sugano, Baifukan 1989, pp. 176–177.

Hamamoto et al, "A 288KBit Fuly Parallel Content Addressable Memory Using Stacked Capacitor Cell Structure"; LSI Research and Development Laboratory, Mitsubishi Electric Corporation, 1991; pp. 205–208.

*Primary Examiner*—Gopal C. Ray
*Attorney, Agent, or Firm*—Oliff & Berridge

[57] ABSTRACT

A priority encoder is provided with priority circuitry for sequentially producing priority-ordered output signals and encoding circuitry for encoding the output signal. Small input, small unit priority circuits are used to form the priority circuitry into a hierarchical structure. An OR output of a small unit priority circuit in a lower hierarchy is used as an input signal of another small unit priority circuit in a higher hierarchy. An output signal of the priority circuit in the higher hierarchy has an address which corresponds to the address of the one input signal and is made an enable signal of the priority circuit in the lower hierarchy. The priority encoder, though simple in structure and formed with a small number of elements, operates at a high speed. Moreover, an encoder with a prefetch circuit is built into the priority encoder provided for a CAM block. While a "hit" signal in a first priority subblock is being encoded, a hit signal in a second priority subblock can be stored in the prefetch circuit. Therefore, the encoding operation is performed without subblock-to-subblock switch time, making the encoder best suitable for a large capacity, high speed CAM.

15 Claims, 14 Drawing Sheets

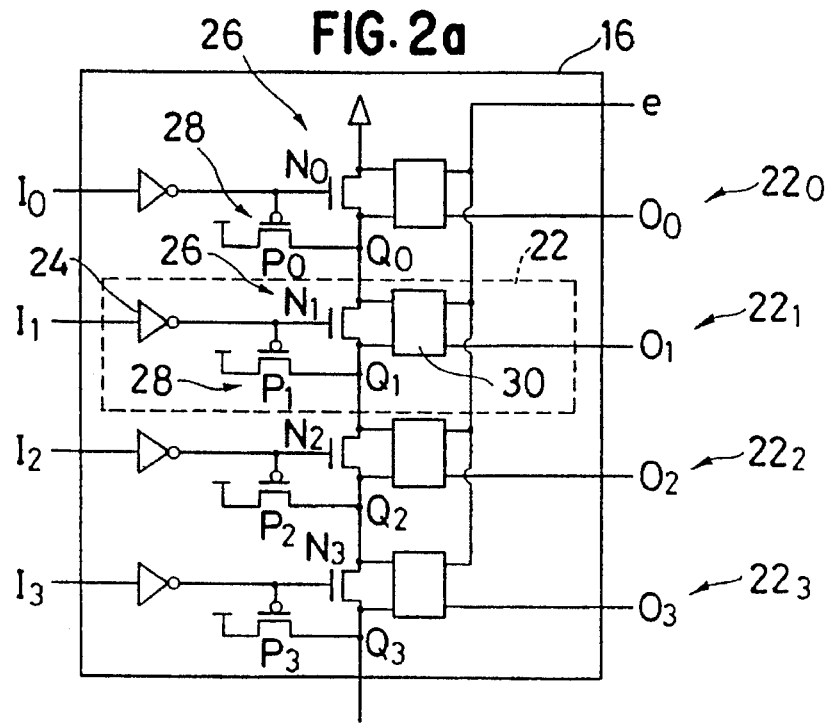
FIG. 2a
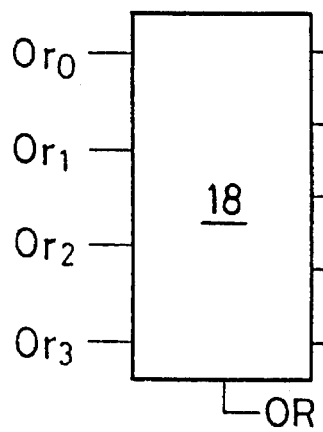
FIG. 2b
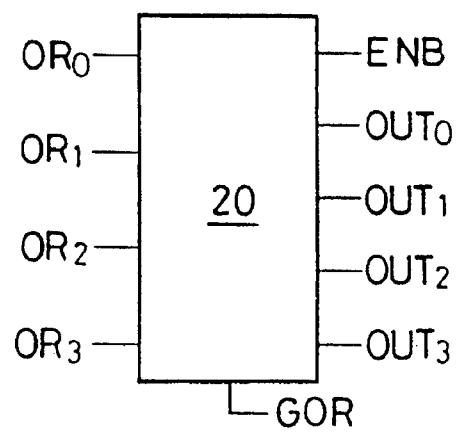
FIG. 2c
FIG. 3
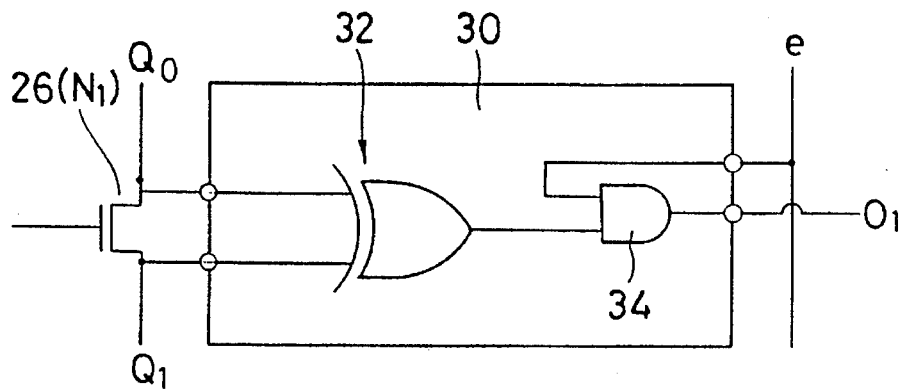

PRIOR ART

PRIOR ART

PRIORITY ENCODER APPLICABLE TO LARGE CAPACITY CONTENT ADDRESSABLE MEMORY

BACKGROUND OF THE INVENTION

The present invention relates generally to encoders, particularly priority encoders (priority encoding circuits) and more particularly to a priority encoder for use in acquiring a binary address output by sequentially encoding, in the order of predetermined priorities, a plurality of match address signals in a content addressable memory (CAM) and like, and to an encoder for sequentially efficiently encoding, in the order of predetermined priorities, a plurality of match address signals from a number of blocks in a large capacity content addressable memory and the like.

Heretofore, associative memories, that is, fully parallel CAMs (Content Addressable Memories), have been widely known as semiconductor storage circuits having the functions of performing the match detection of retrieval data and stored data concurrently in terms of all bits and outputting the match address of stored data or stored data (see "Design of CMOS VLSI," pp 176–177, edited by Tetsuya Iizuka and supervised by Takuo Sugano, Baifukan, 1989).

Content-addressed retrieval, instead of retrieval by means of physical memory addresses, is common to content addressable memories (CAMs). Therefore, the basic function of CAM, unlike an ordinary memory, is to input retrieval data so as to output a word address at which data matching the retrieval data has been stored. However, only one word is not necessarily matching and there may be a plurality of them. When the plurality of match words are obtained like this, a correct encode output is unavailable with an ordinary encoder. Consequently, it is necessary to assign a proper priority to a signal before the signal is applied to an ordinary binary encoder so that only one signal is at an ON potential, the signal being sequentially switched to another in synchronization with a clock signal.

For the reason stated above, a priority encoder (priority address encoder) has been employed. Assuming the highest priority is given to an input signal $A_3$ among those $A_3$, $A_2$, $A_1$, $A_0$ and the lowest priority is given to $A_0$ while $A_2$ and $A_1$ are in the order of descending priorities in a conventional priority encoder 200 having combinations of invertors 202 and NAND gates 204 as shown in FIG. 16, for example, the encoder outputs the first priority address among addresses at which the input signal is "0" even though a plurality of match signals "0" H (high) are applied as the input signals $A_3$–$A_0$. In other words, the priority encoder 200 is so arranged as to output the address (N, $X_1$, $X_0$)=(0, 1, 0) of the first priority input signal $A_2$ when, for example, $A_3$="0" and $A_2$="0", irrespective of the signal values of lower priority input signals $A_1$, $A_0$, that is, even if the value is "0" H (high) (match) or "0" L (low) (mismatch).

Consequently, a truth table is directly used for the NAND gate 204 to accomplish such a priority encoder and even though a plurality of 1's exist in the input signal, the address output of the first priority input signal is obtained. Nevertheless, the circuit becomes increasingly complex in construction as the number of input signals increases and this still poses a critical problem in that a considerable number of elements such as gates are required. In the priority encoder like this, the gates so arranged as to receive lower priority signals are to receive all the signals higher in priority than the former and therefore the NAND gate provided in the portion of the lowest priority input signal is to receive all the input signals. As the number of input signals increases, a multistage gate will be needed because it is impossible to arrange the gates in one stage. Thus, the number of elements sharply increases.

Accordingly, Japanese Patent Publication No. 47038/1990 discloses an priority encoder having a circuit, which is called an priority circuit in the present specification, for defining only the first priority address as 1 out of input signals whose addresses are 1 and for outputting a 0 signal representing an input signal at any other addresses; in other words, a priority assigning portion is separated as a priority circuit, whereas an ordinary address encoder is used to encode a signal (a priority signal) whose only address output therefrom is 1. As shown in FIG. 17, the priority encoder thus disclosed is such that the encoding circuit elements provided for respective signal input terminals are similar in configuration, irrespective of the priority order. With respect to the addresses on one side, that is, those on the lower side in the encoder like this, priority is increased in the descending order.

More specifically, P-channel MOS transistors $212_0$, $212_1$, $212_2$ to be controlled by the input signals applied from respective signal input terminals $IN_0$, $IN_1$, $IN_2$ (the input signals being applied to respective gates) are connected serially in the priority encoder shown in FIG. 17. With a propagation control signal input terminal $P_0$ in the lowermost part of FIG. 17 as "0" (H), these PMOS transistors $212_0$, $212_1$, $212_2$ are connected transistor-to-transistor (in the preceding stage of each in FIG. 17), by means of the above-noted input signals, to respective N-channel MOS transistors $214_0$, $214_1$, $214_2$ to be exclusively (reversely) controlled, the other end of the terminal being grounded (fixed to "0" L potential). Moreover, there are provided AND gates $216_0$, $216_1$, $216_2$ for ANDing the signals in the following stage of the respective PMOS transistors $212_0$, $212_1$, $212_2$, that is, at the propagation control signal input terminals $P_0$, $P_1$, $P_2$ of the respective encoding circuit elements with the signals of nodes $Q_0$, $Q_1$, $Q_2$ connected via the respective NMOS transistors to the respective signal input terminals $IN_0$, $IN_1$, $IN_2$. The results are output from $OUT_0$, $OUT_1$, $OUT_2$. Even if 1 is applied to the plurality of $IN_0$, $IN_1$, $IN_2$, that is, provided $IN_0$="0", $IN_1$=$IN_2$="0", for example, a clock signal $C_1$ makes the signal state of the nodes $Q_0$, $Q_1$, $Q_2$ respectively ($Q_0$, $Q_1$, $Q_2$)=(0, 1, 1). Thus the PMOS transistors $212_0$, $212_1$, $212_2$ are respectively turned on, off, off; the NMOS transistors $214_0$, $214_1$, $214_2$ are respectively turned off, on, on; and the propagation control signal input terminals ($P_0$, $P_1$, $P_2$)=(1, 1, 0). As a result, the output terminals ($OUT_2$, $OUT_1$, $OUT_0$)=(0, 1, 0), whereby output signals (0, 1, 0) are output. In other words, the output signals (0, 1, 0) with respect to the higher priority IN1="0" are first output.

Subsequently, the nodes ($Q_0$, $Q_1$, $Q_2$)=(0, 0, 1), that is, only the node $Q_1$ whose output signal is "0" is reset by reset circuits $218_0$, $218_1$, $218_2$ comprising the NMOS transistors for receiving output signals (0, 1, 0) and its output signal turns from "0" to "0". Consequently, the PMOS transistor $212_1$ is turned on from the off state, whereas the NMOS transistor $214_1$ is turned off from the on state. In other words, the propagation control signal "0" is propagated up to the terminal $P_2$ and therefore the propagation control signal input terminal $P_2$=1, whereas output terminals ($OUT_2$, $OUT_1$, $OUT_0$)=(1, 0, 0), whereby the output signal (1, 0, 0) is applied to $IN_2$="0" having the second priority. Even when the plurality of "1"s are applied to the signal input terminals $IN_0$, $IN_1$, $IN_2$, the selection of each located below is given the first priority and only one of the output terminals $OUT_0$, OUT$_1$, OUT$_2$ sequentially outputs a signal of "0". In this case, the output signals (0, 1, 0) and (1, 0, 0) whose only one address is 1 are encoded by the conventional address encoder 220 as shown in FIG. 15, for example. Even when the number of inputs increases further, entirely similar priority circuit elements are additionally provided so as to cause the same operation to be performed.

The priority circuit of FIG. 17 has the priority circuit elements which are equally uniform in configuration and even if these elements in combination with the conventional address encoder 220 of FIG. 15 are used as a priority encoder, this priority encoder has less elements but operates at relatively high speed as compared with the priority encoder of FIG. 16, particularly when the number of inputs is small. If, however, the number of inputs to a large capacity CAM increases, as many priority circuit elements stated above as the inputs required are connected to the CAM. Since it is necessary for the priority-determining propagation control signal to be transmitted correspondingly through the PMOS transistors serially connected from bottom to top, the output signal with only one address as 1 is output as the number of inputs increases and the priority delays varying after the output is reset by the reset circuits 218 using the output itself. The problem is that it takes time until the second priority signal is output.

As set forth above, CAM employs the priority encoding circuit (priority encoder) for encoding and outputting the plurality of match signals (hit signals) in the order of predetermined priorities.

In a large capacity CAM, however, the number of words is generally very large in contrast to the word length. For this reason, a cell array is divided into a plurality of blocks and it is an important problem how priority encoders are arranged. In other words, the priority encoders will occupy a large area and power consumption will also be on the increase if the priority encoder is provided for every block of CAM. As the number of blocks increases because of the division of the array, the area thus occupied thereby and the power consumption proportionally increase further.

As a result, there has been proposed a content addressable memory in which one main priority encoder is provided for the plurality of blocks and a block priority encoder to be separately provided is used for the block in which encoding is carried out by the main priority encoder.

FIG. 18 shows such a content addressable memory (CAM). As shown in FIG. 18, the content addressable memory 240 is divided into four CAM blocks 242 and each CAM block 242 is further divided into eight CAM subblocks 244. A priority encoder 250 is structurally hierarchical in that there are installed four main priority encoders 252, each being for the CAM block 242 having eight of the CAM subblocks 244, and one subblock priority encoder 254 is provided every four CAM blocks. As shown in FIG. 19 further, the CAM subblock 244 comprises a CAM subarray 246 having a predetermined number of CAM words with predetermined word length and its control unit including a hit signal register 248 for holding a hit signal resulting from the hitting of retrieval data against a CAM word.

At the time of match retrieval in the CAM block 242, the hit signals of all words in each subblock 244 are held by the hit signal register 248 and a subblock hit signal indicating the presence of a match word in the subblock 244 is simultaneously generated by an OR circuit (not shown) of the control unit in each CAM block 244. On receiving the signal, the subblock priority encoder 254 subsequently generates a subblock selection signal indicating the first priority CAM subblock 244 and the subblock priority encoder 254 also generates an encoded subblock address. On receiving the block selection signal, a switch circuit (not shown) of the subblock thus selected is then activated to transfer the data (hit signal) held in the hit signal register 248 to the main priority encoder 252 as an output signal. Thereafter, the main priority encoder 252 generates a hit memory word address resulting from the hit signal thus transferred and encoded in the order of predetermined priorities in the CAM block 244. The priority encoder 250 combines the hit memory word address and the aforementioned subblock address and outputs the encoding logical address of the hit memory word of the CAM.

In the conventional CAM memory 240 shown in FIGS. 18 and 19, the priority encoder (encode circuit) 250 comprises the main priority encoder (priority encode circuit) for controlling the plurality of CAM subblocks 244 and the subblock priority encoder 254 for assigning priority to the CAM subblocks 244 for encoding purposes. The order of priorities is first determined among the plurality of the subblocks 244 and before being encoded, the output signal of the first priority subblock 244 is applied to the main priority encoder 252. The encode circuit can be made relatively small in configuration, whereas the circuit area relative to the whole circuit scale of the CAM memory 240 is reduced, whereby large scale integration is made possible.

Notwithstanding, subblock-to-subblock switch time becomes necessary when the output signal (hit signal data) from the second priority CAM subblock 244 is encoded after the output signal (hit signal data) from the first priority subblock 244 is encoded by the main priority encoder 252 and output. In other words, it takes time to transfer the hit signal data from the hit signal register 248 of the second priority subblock after an encoded address is output from the main priority encoder 252 and there still arises a problem of making an efficient encoding operation unfeasible.

BRIEF SUMMARY OF THE INVENTION

A first object of the present invention made to solve the foregoing problems in the prior art is to provide a priority encoder applicable to a large capacity content addressable memory (CAM) which is simple in construction, formed with a smaller number of elements and operative at high speed in order to sequentially output one of a plurality of addresses at which match signals are output.

A second object of the present invention is to provide an encode circuit applicable to a large capacity content addressable memory which is required to process large capacity data and provided with CAM blocks, each comprising a plurality of CAM subblocks, and which is capable of encoding output signals from a number of CAM subblocks efficiently without delay in subblock-to-subblock switch time.

In order to accomplish the first object by the first aspect of the present invention, there is provided a priority encoder having priority means for producing from a plurality of input signals output only one signal including signals to be at only one address when the signals to be encoded at least at two addresses are included in the plurality of input signals and for sequentially producing the output signals in the order of predetermined priorities, and encode means for receiving the output signals of the priority means as inputs and encoding the one address at which the signal to be encoded is included in the output signals, is such that small unit priority circuits are used to form the priority means into a hierarchical structure with input signals less than the plurality of input signals as inputs, that priorities are simultaneously assigned to the plurality of small unit priority circuits with respect to those in at least the low hierarchy, and that with the OR output of the small unit priority circuit in the lower hierarchy as one input signal of the small unit priority circuit in the higher hierarchy, the output signal of the priority circuit in the higher hierarchy at an address corresponding to the address of the one input signal is made the enable signal of the priority circuit in the lower hierarchy.

There is provided by the fourth aspect of the present invention a priority encoder having at least one priority circuit for producing from a plurality of input signals output signals including encoding only one signal to be encoded at only one address when the encoding signals to encode at least at two addresses are included in the plurality of input signals and for sequentially producing the output signals in the order of predetermined priorities, and encode means for receiving the output signals of the priority means as inputs and encoding said one address at which the encoding signal to encode is included in the output signals, wherein said priority circuit is capable of selectively defining said priority in one or opposite direction.

In the fourth aspect of the present invention, preferably, said priority encoder has a plurality of priority circuits, each being a hierarchized small unit priority circuit with input signals less than the plurality of input signals as inputs, wherein the OR output of the small unit priority circuit in the lower hierarchy is made one input signal of the small unit priority circuit in the higher hierarchy and wherein the output signal of the priority circuit in the higher hierarchy at an address corresponding to the address of the one input signal is made the enable signal of the priority circuit in the lower hierarchy.

There is provided by the second aspect of the present invention, in the above first and fourth aspects, a priority encoder wherein said priority means has an N hierarchy, and wherein assuming the number of inputs in the small unit priority circuit in the highest hierarchy is $2^a$ ($a \geq 1$), the number of inputs in the small unit priority circuit in the lowest hierarchy is $2^b$ ($b \geq 1$), and the number of inputs in the small unit priority circuit in the intermediate hierarchy is $2^c$ ($c \geq 0$), this priority circuit being in the (N–2 (N$\geq$2)) hierarchy, said encode means are provided with an encode circuit of highest order affixed to $2^a$ of outputs of said priority circuit in the highest hierarchy and used for encoding highest order a bits of the address of said signal to be encoded, an encode circuit of lowest order affixed to $2^b$ of outputs of said priority circuit in the lowest hierarchy and used for encoding lowest order h bits of said address, and (N–2) intermediate encode circuits affixed to $2^c$ of outputs of said priority circuit in the intermediate hierarchy and used for encoding intermediate C bits of said address.

There is provided by the third aspect of the present invention, in the above second aspect, a priority encoder wherein a partial encoder is provided between said priority circuit and at least one of said lowest order encode circuit, (N–2) intermediate encode circuits and highest order encode circuit.

In the above aspects, preferably, said priority circuit comprises a plurality of priority circuit element arrays and wherein said priority circuit element array comprises signal input terminals, a first switch circuit for generating a propagation control signal toward the preceding or following priority circuit element array by means of the input signal applied to the input terminal, a second switch circuit for propagating the propagation control signal propagated from the following or preceding priority circuit element array to the preceding or following priority circuit element array, said second switch circuit being exclusively controlled by said input signal with respect to said first switch circuit, and logical arithmetic means for performing logical operations on one of these propagation control signals and said input signal and for outputting the result of the operation when said enable signal is activated.

Preferably, said priority circuit makes said propagation control signal said OR output, said propagation control signal being output from the priority circuit element array of lowest or highest order.

Preferably, said priority circuit has means for directly performing arithmetic operations on all of said input signals thus applied and outputting the result as an OR output.

In order to accomplish the second object by the fifth aspect of the present invention, there is provided an encoder having priority encoders provided with respect to an associative memory block having a plurality of associative memory subblocks arranged with a plurality of associative memory words having continuous logical addresses, a prefetch buffer circuit built into said priority encoder, and priority subblock encoders in said plurality of the associative memory subblocks, wherein among match signals each of which indicates that data stored in each of the memory word matches retrieval data, the match signals in a second priority associative memory subblock are applied to said prefetch buffer circuit while said priority encoder is encoding the match signals in a first priority associative memory subblock determined by said priority subblock encoder.

In the above fifth aspect, preferably, further having means for resetting the match signals one after another in encoding of said match signals in said associative memory subblock in said priority encoder, and means for detecting the termination of encoding of said match signals in said associative memory subblock performing the encoding operation, wherein said match signals applied to said prefetch buffer circuit is encoded when the termination of the encoding operation is detected by said detection means.

BRIEF DESCRIPTION OF THE DRAWINGS

FIGS. 2(a), 2(b) and 2(c) are schematic block diagrams of small unit priority circuits for use in the priority encoder according to the present invention.

FIG. 3 is a block diagram of a logical arithmetic circuit for use in the small unit priority circuit of the priority encoder according to the present invention.

DETAILED DESCRIPTION OF PREFERRED EMBODIMENTS

Figure 1:
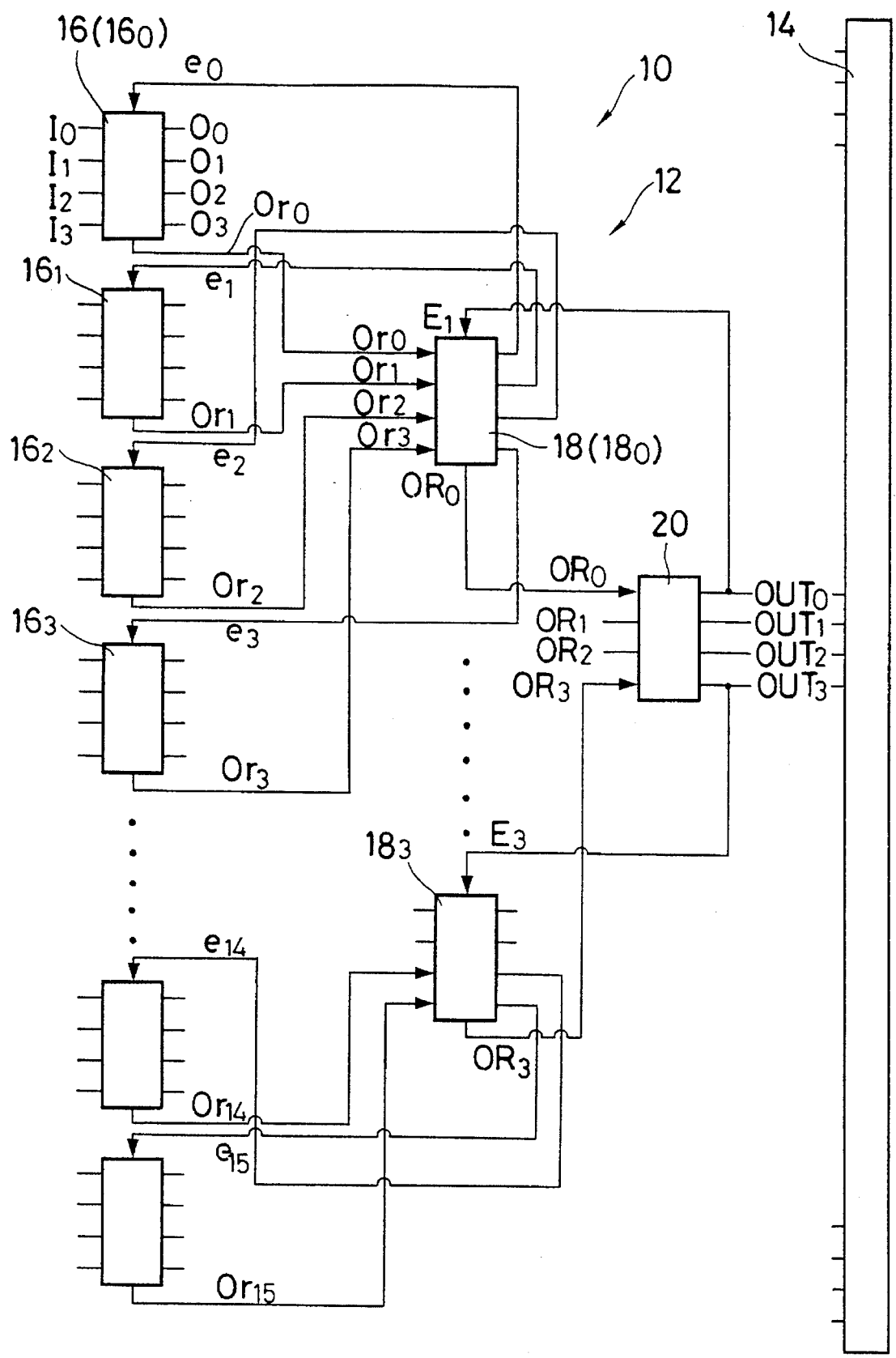
FIG. 1 is an overall block diagram of a priority encoder embodying the present invention.
Figure 4:
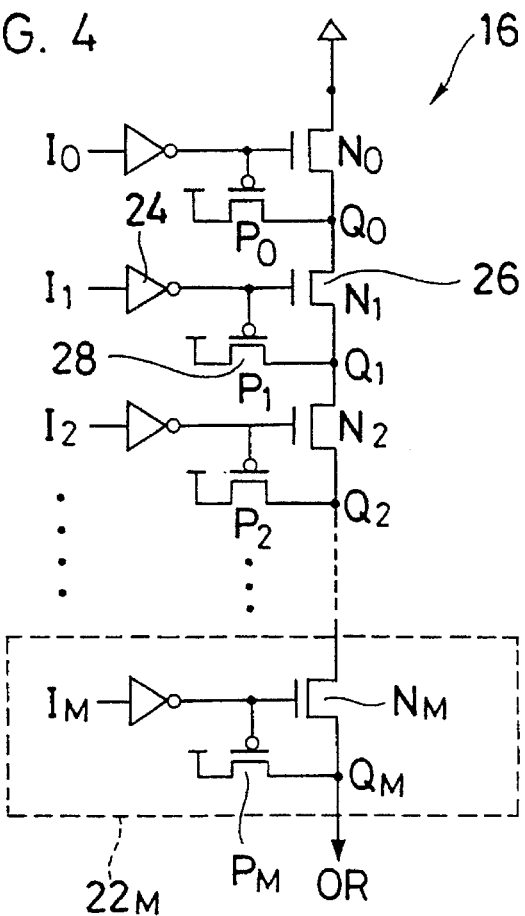
FIG. 4 is a partial block diagram of another priority circuit for use in the priority encoder according to the present invention.
Figure 5:
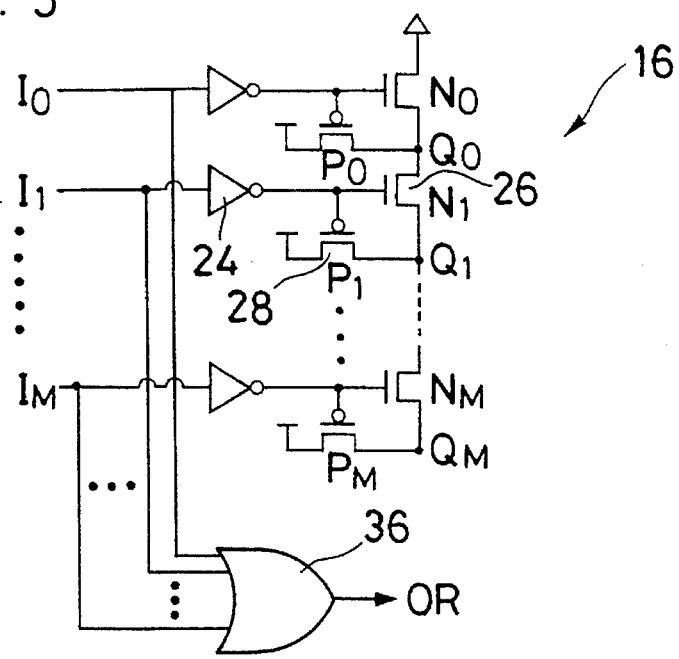
FIG. 5 is a partial block diagram of another priority circuit for use in the priority encoder according to the present invention.

A description will subsequently be given of a priority encoder and an encode circuit embodying the present invention.

Referring to FIGS. 1–10, a detailed description will first be given of a priority encoder according to the present invention.

A priority encoder in the first aspect of the present invention is such that use is made of a circuit having a smaller number of elements constituting a priority circuit unit (circuit unit for giving priority) with respect to one input signal; e.g., transistors operating mutually exclusively (reversely) depending on the input signal, and that a logical arithmetic means is used to detect the propagation state of a propagation control signal in the preceding and/or following stage of the transistor serially connected on one side or the state of the input signal, in order to form a circuit capable of delivering a priority output signal in which only one address is "0", so that only a predetermined number of small unit priority circuits are formed into a hierarchical group.

Assuming M pieces of priority circuit elements are formed in an N hierarchy, the number of possible input signals will come up to $M^N$. Therefore, time in the order of $M^2$ is taken in the small unit priority circuit when the priority is changed at this time in the priority encoder according to the present invention and as there exist an N hierarchy, time in the order of $M^2 \cdot N$ is totally needed. On the contrary, time in the order of $(M^N)^2 = M^{2N}$ is to be taken on the assumption that the total number of input signals is $M^N$ as in the case of an encode circuit disclosed in Japanese Patent No. 47038/1990 wherein no grouping or reduction to a single hierarchy is implemented. Consequently, the priority can be varied quicker than before according to the present invention particularly when the total number of input signals is large as in a case where the priority circuit is applied to a large capacity CAM. Moreover, not so many elements are necessary to use in comparison with the case of the single hierarchy unless the number of hierarchical layers is large. It is possible to select an output signal in which a match signal exists at only one address, that is, a priority signal in the order of high priorities from a number of input signals in which the plurality of match signals exist and to sequentially output what has been selected. The output signal thus selected is being then encoded one at a time. In this way, a high-speed priority encoder having a smaller number of elements can be materialized according to the present invention.

A priority encoder in the second aspect of the present invention is designed to encode a predetermined number of bits by means of the encode circuit attached to a small unit priority circuit layer-to-layer in each hierarchy of priority means. Accordingly, it is possible in this aspect of the present invention to increase the speed of not only assigning a priority to an input signal but also encoding any output signal, whereby the total operation can be facilitated in speed by a large margin.

A priority encoder in the third aspect of the present invention is designed to decrease the number of transistors to be connected to the address line of the encode circuit by fitting an encode circuit via a partial encoder to a small unit priority circuit in each hierarchy on a priority circuit basis in order to increase the speed of not only the encoding operation but also the operation of the whole system.

A priority encoder in the fourth aspect of the present invention is designed, irrespective of the single- or multi-hierarchy, to make it possible to control the directions of propagation control input signals of the transistors serially connected in priority circuit elements formed into a group in the aforementioned priority circuit. In addition, the aforementioned logical arithmetic means is formed with an exclusive OR circuit, whereby the priority direction may be alternatively switched. Therefore, specific or bidirectional retrieval in any large capacity CAM or the like can be conducted freely according to this fourth aspect.

Referring to the accompanying drawings, a detailed description will subsequently be given of a priority encoder as the preferred embodiment of the present invention.

FIG. 1 is a schematic block diagram of a priority encoder in the first aspect of the present invention. As shown in FIG. 1, a priority encoder 10 according to the present invention comprises a priority circuit means 12 for sequentially outputting signals, each including only one match signal with a predetermined priority, on receiving a number of input signals having a plurality of match signals, and an encode circuit means 14 for encoding a match signal address existing in the output signal thus delivered sequentially.

The priority circuit means 12 has a ternary hierarchy: the tier of the lowest order comprises sixteen 4-input small unit priority circuits (hereinafter called "unit circuits") 16; the intermediate tier comprises four similar 4-input small unit priority circuits 18; and the tier of the highest order comprises one similar 4-input small unit priority circuit 20. Therefore, the priority circuit means 12 is allowed to have 64 inputs because of sixteen unit circuits 16 in the tier of the lowest order. In other words, 64 inputs of the circuit means 12 are formed into 16 groups, each having four inputs. The small unit priority circuit 16 is formed with a group of four inputs and there are employed 16 small unit priority circuits. The 16 small unit priority circuits are formed into four groups, one group comprising four unit circuits 16. The four unit circuits 16 constituting the one group are connected to one small unit priority circuit 18 forming the intermediary tier. Moreover, four of the unit circuits 18 are formed into a group and connected to the small unit priority circuits 20 in the tier of the highest order.

The priority circuit means 12 shown in FIG. 1 has 64 inputs and the ternary hierarchy with the 4-input unit circuits 16, 18 and 20 as component units. However, the present invention is not limited to this arrangement and there may be a hierarchical structure in which the number of elements in the respective unit circuits and that of hierarchical tiers are to be selected properly in proportion to the total number of inputs and that of inputs in the respective unit circuits for use. Although the unit circuits 16, 18 and 20 constituting the respective hierarchical tiers have been defined as those having the same number of inputs, the present invention is not limited to this arrangement but there may be a different one. The smaller the number of inputs to the unit circuit, the more it is convenient to increase the priority variation speed. Nevertheless, an increase in the number of unit circuits required will result in the number of hierarchical tiers if the number of inputs to the unit circuit is too small and will further cause the number of accompanying elements and peripheral circuits to increase, which will be undesirable. Accordingly, the present invention suggests a multi-hierarchy in which the number of tiers should be determined properly by making selective the total number of inputs and that of inputs to the unit circuit (either exclusive or multi-kind) usable for each hierarchical tier.

Figure 15:
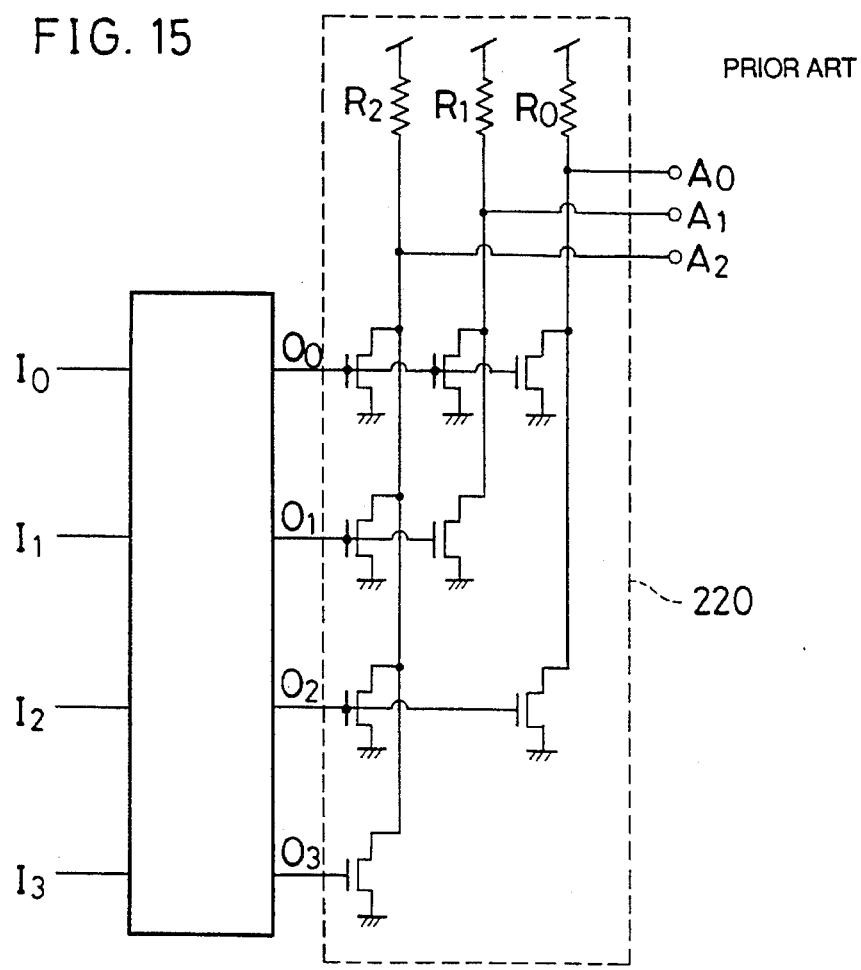
FIG. 15 is a block diagram of a conventional address encoder.
Figure 16:
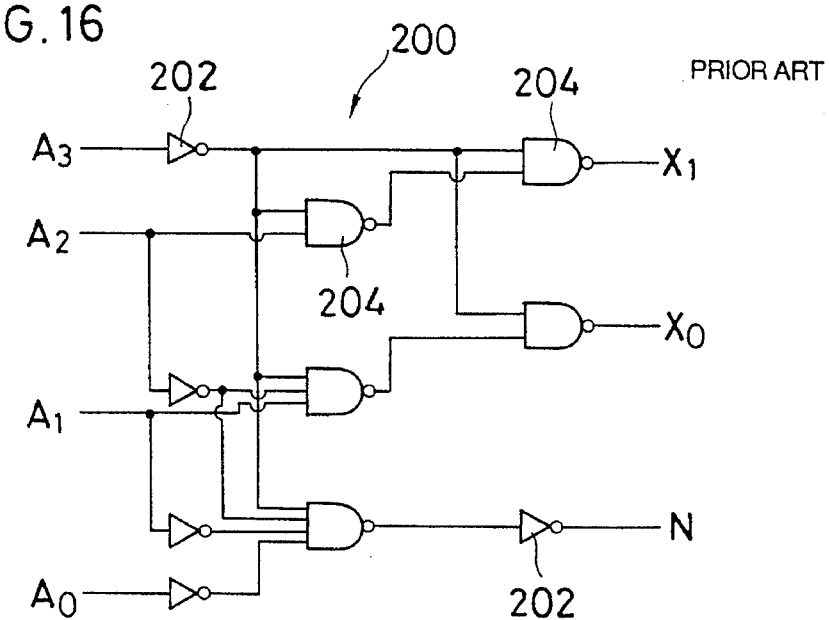
FIG. 16 is a block diagram of a conventional priority encoder.

The encode circuit means 14 for use in the priority encoder 10 in this aspect of the present invention is not specifically restrictive as long as the one match signal address output with a predetermined priority can be encoded and any known encoding means is usable as in the case of an address encoder 220 of FIG. 15.

As shown in FIG. 2(a), the small unit priority circuit 16 is arranged so that priority is increased upward, that is, in the upper direction and has four input units $I_0$, $I_1$, $I_2$ and $I_3$, four output terminals $O_0$, $O_1$, $O_2$ and $O_3$, an enable signal input terminal e, an OR output terminal or, and four priority circuit elements 22 ($22_0$, $22_1$, $22_2$ and $22_3$). In this case, the second circuit element $22_1$ (hereinafter simply called 'circuit element') will be described as what represents the priority circuit elements 22 by way of example. The circuit element comprises an invertor 24 for inverting the input signal applied to the input terminal $I_1$, an N-channel MOS transistor 26 ($N_1$), a P-channel MOS transistor 28 ($P_1$), the output of the invertor 24 being connected to the gate electrodes of both transistors 26, 28 which are mutually exclusively controlled by the input signal, and a logical arithmetic circuit 30 activated by the enable signal applied from the enable signal input terminal e with the source and drain electrodes of the NMOS transistor 26 as inputs and with the output terminal $O_1$ as an output.

One electrode (e.g., the source electrode) of the NMOS transistor $N_1$ is connected to the other electrode (e.g., the drain electrode) of the NMOS transistor $N_0$ of the circuit element $22_0$ of high order at a node $Q_0$, whereas the other electrode (e.g., the drain electrode) of the NMOS transistor $N_1$ is connected to one electrode (e.g., the source electrode) of the MOS transistor $N_2$ of the circuit element $22_2$ of low order at a node $Q_1$. The NMOS transistors $N_0$, $N_1$, $N_2$, $N_3$ are thus connected serially at nodes $Q_0$, $Q_1$, $Q_2$. A node $Q_3$ under the NMOS transistor $N_3$ is connected to the OR output terminal or. Moreover, the electrode (e.g., the source electrode) above (on one side of) the NMOS transistor $N_0$ of the uppermost stage is fixed to the potential (the signal state) indicating "0" or grounded. On the other hand, one electrodes (e.g., the source electrodes) of the respective PMOS transistors $P_0$, $P_1$, $P_2$, $P_3$ are fixed to the potential (the signal state) indication "1" or connected to a power supply $V_{pp}$, whereas the other electrodes thereof (e.g., the drain electrodes) are connected to the respective nodes $Q_0$, $Q_1$, $Q_2$, $Q_3$. The unit circuit 16 having four inputs and four outputs is formed in this way.

A description will subsequently be given of the operation of assigning priority in the unit circuit 16, that is, the operation of outputting a priority-ordered output signal with only the first priority address as a match signal "1" even though a plurality of match signals "1" are applied from $I_0$–$I_3$. When attention is riveted to the circuit element $22_1$ of the unit circuit 16, the $N_1$ transistor 26 is turned off and the $P_1$ transistor 28 is turned on if an $I_1$ input is 1. Therefore, the $Q_1$ node is set at 1 by the $P_1$ transistor 28. If the $I_1$ input is 0, the $N_1$ transistor 26 is turned on and the $P_1$ transistor 28 is turned off. Therefore, the logical value of the $Q_1$ node becomes equal to that of the $Q_0$ node higher by one level. If an input from $I_k$ is 1, $Q_k$ becomes 1 and consequently $Q_n(n \geq k+1)$ can be exclusively 1, irrespective of whether $I_n$ is 1 or 0. In other words, (the signal state of) a node $Q_{k+1}$ is 1 if $I_{k+1}=1$ and $Q_{k+1}=Q_k$ if $I_{k+1}=0$ and further $Q_{k+1}=1$ from $Q_k=1$.

As a result, with a plurality of I inputs being 1 in FIG. 2(a), "0" representing a propagation control signal is transmitted up to the NMOS transistor 26 located on the uppermost side while the corresponding serially-connected NMOS transistors 26 (N) remain off. However, the propagation control signal "0" is not transmitted to each lower node Q and 1 is retained in all the lower nodes Q. Consequently, the logical arithmetic circuit 30 may be used to detect the extent to which the control signal "0" has been transmitted. When all four inputs of $I_0$–$I_3$ of the unit circuit 16 become "0" the control signal "0" is transmitted up to the OR output terminal or and the absence of "1" in all four input signals is made known. The hierarchical structure can be accomplished by making the OR output or an input of the unit circuit 18 of higher order.

FIGS. 2(b) and 2(c) are schematic diagrams of unit circuits 18 and 20 forming an intermediate hierarchical tier and a hierarchical tier of the highest order, respectively. As the unit circuits 18 and 20 shown in FIG. 2(b) and 2(c) have the same structure as that of the unit circuit 16 in the tier of the lowest order shown in FIG. 2(a) except for the signals input to and output from the input/output signal terminals, the illustration of the arrangement thereof will be omitted. Input terminals $or_0$, $or_1$, $or_2$, $or_3$ of the unit circuit 18 shown in FIG. 2(b) are respective OR outputs $or_0$, $or_1$, $or_2$, $or_3$ of four unit circuits $16_0$, $16_1$, $16_2$, $16_3$ of the unit circuit 16 forming the hierarchical tier of the lowest order shown in FIG. 1. If the outputs $Ot_k$ (k=0, 1, 2, 3) of the unit circuit 18 are connected to enable terminals $e_k$ (k=0, 1, 2, 3) of circuits $16_k$ (k=0, 1, 2, 3) corresponding to input signals $or_k$ (k=0, 1, 2, 3), No. k circuit $16_k$ can be activated selectively only when $Ot_k=1$. Therefore, the OR output may be used to see whether 1 exists in the or input of the unit circuit 18 and the OR outputs ultimately indicate under the control of the circuit 18 that any one of the I input signals of the plurality of unit circuits 16 is 1.

FIG. 2(c) shows one unit circuit 20 in the tier of high order with the OR output of the circuit 18 as an input and as stated above, the unit circuit 20 can entirely be the same in structure as the unit circuits 16 and 18 respectively shown in FIGS. 2(a) and 2(b). The unit circuit 20 shown in FIG. 2(c) uses the OR outputs of all the four unit circuits 18 forming the intermediate hierarchical tier as OR inputs $OR_k$ (k=0, 1, 2, 3) and outputs $OUT_0$, $OUT_1$, $OUT_2$, $OUT_3$ corresponding to the OR inputs $OR_k$ (k=0, 1, 2, 3) are applied to respective enable signal input E as respective enable signals of all the four unit circuits 18 in the intermediate hierarchical tier. Therefore, the OR output GOR of the unit circuit 20 may be used to see whether 1 exists in the OR input $OR_k$ of the unit circuit 20. The enable signal ENB of the unit circuit 20 itself is supplied with a predetermined clock signal separately until all of $OUT_k$ (k=0, 1, 2, 3) output "0", that is the OR output GOR becomes "0". While the outputs $OUT_k$ of the unit circuit 20 are outputting "1", the small unit priority circuit having "1" (match signal) conversely exists in a group of low order equivalent to the address to which the only signal (hereinafter called 'priority-ordered signal') selected from among the input signals of the priority circuit means 12 and having "1" at the first priority address applies "1".

As shown in FIG. 3, the logical arithmetic circuit 30 comprises, for example, an exclusive OR gate (mismatch circuit) 32 for exclusively ORing the signal state between the drain and source of the serially-connected NMOS transistor 26 ($N_1$), that is, the logical value between the nodes $Q_0$ and $Q_1$ and an AND gate 34 for ANDing the output of the exclusive OR gate 32 and the enable signal e. In this logical arithmetic circuit 30, when the nodes $Q_0$ and $Q_1$ mismatch that is the propagation control signal "0" has propagated up to the node $Q_0$ of the NMOS transistor 26 ($N_1$) of the circuit element $22_1$, but has not been propagated up to the node $Q_1$, the exclusive OR gate 32 outputs "1" and when the enable signal e is "0", that is, active simultaneously, the AND gate 34 applies "0" to the output terminal $O_1$. When the nodes $Q_0$ and $Q_1$ match or when the enable signal e is "0", the output of the output terminal $O_1$ is "0". The logical arithmetic circuit 30 is not limited in configuration to the example shown in FIG. 3 but may be so arranged as to perform desired logical operations with a combination of various gates. Moreover, the input of the logical arithmetic circuit 30 need not necessarily be applied between the nodes $Q_0$ and $Q_1$ but may be either one of them and an input signal or its inverted value and besides the contents of the logical operation may be selected properly in accordance with the signal value.

The arrangement of the circuit for effecting priority selection hierarchically by employing the small unit priority circuits 16, 18 and 20 contributes to high-speed operation as compared with a case where all N-channel transistors are serially connected in the form of the single-hierarchical unit circuit 16. Moreover, the signal state (logical value) of the node $Q_M$ of the lowest-order circuit element $22_M$ of the priority circuit 16 shown in FIGS. 2 and 4 may be used as the OR output. Using the logical value of the node $Q_M$ is extremely advantageous in that no special circuit is required to obtain the OR output. However, the present invention is not limited to this application and an ordinary OR gate 36 or the like may be used to obtain the OR output directly from the input signals $I_0$, $I_1$–$I_M$ as in the case of a priority circuit of FIG. 5 in order to attain high-speed operation. In so doing, tier-to-tier signal propagation is facilitated and the operational speed will be increased further. This is due to the fact that the number M of inputs $I_0$–$I_M$ is prevented from increasing as hierarchization makes possible the use of small unit priority circuits. In other words, the total response can be accelerated by using the OR gate 36 to speed up not only the OR output but also propagation to the hierarchical tier of high order.

When the first priority-ordered output signal having one match signal is output from an input signal having a plurality of match signals, the output should be used to reset the input side in a case where the address of the second priority match signal exists in the same small unit priority circuit. In other words, assuming $I_1$=1, $I_3$=1 in the priority circuit 16 of FIG. 2(a), for example, only the output $O_1$ is "1" when the enable signal e is "1". If the $O_1$ output is input directly to the input $I_1$ of the circuit element $22_1$ to reset the input side, $I_1$=0 and therefore the NMOS transistor 26 ($N_1$) is turned on, whereas the PMOS transistor 28 ($P_1$) is turned off, and node $Q_1$=$Q_0$= 0. Since the NMOS transistor $N_2$ is held ON, node $Q_0$=$Q_1$= $Q_2$=0, whereas only node $Q_3$ is 1. The second priority $I_3$=1 is then selected as the next output signal and $O_3$=1.

Figure 6A:
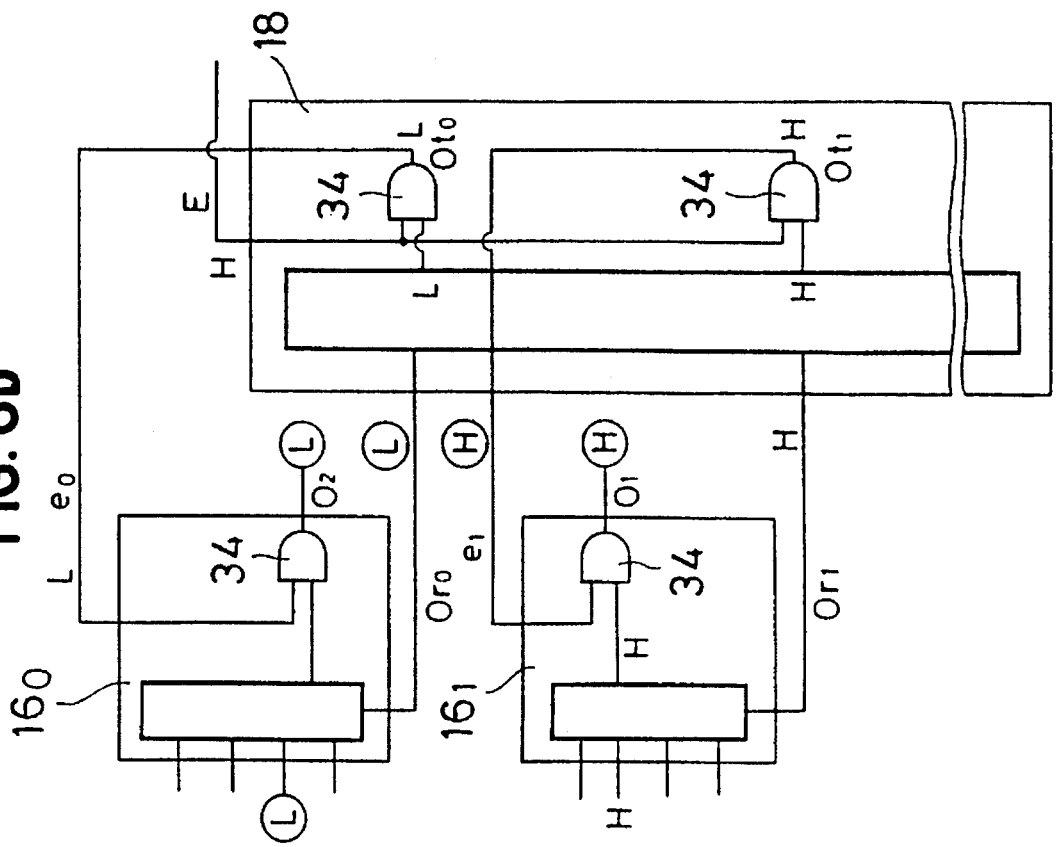
FIGS. 6 (a) and 6 (b) are diagrams respectively illustrating the priority operations of the priority circuit for use in the priority encoder according to the present invention.
Figure 6B:
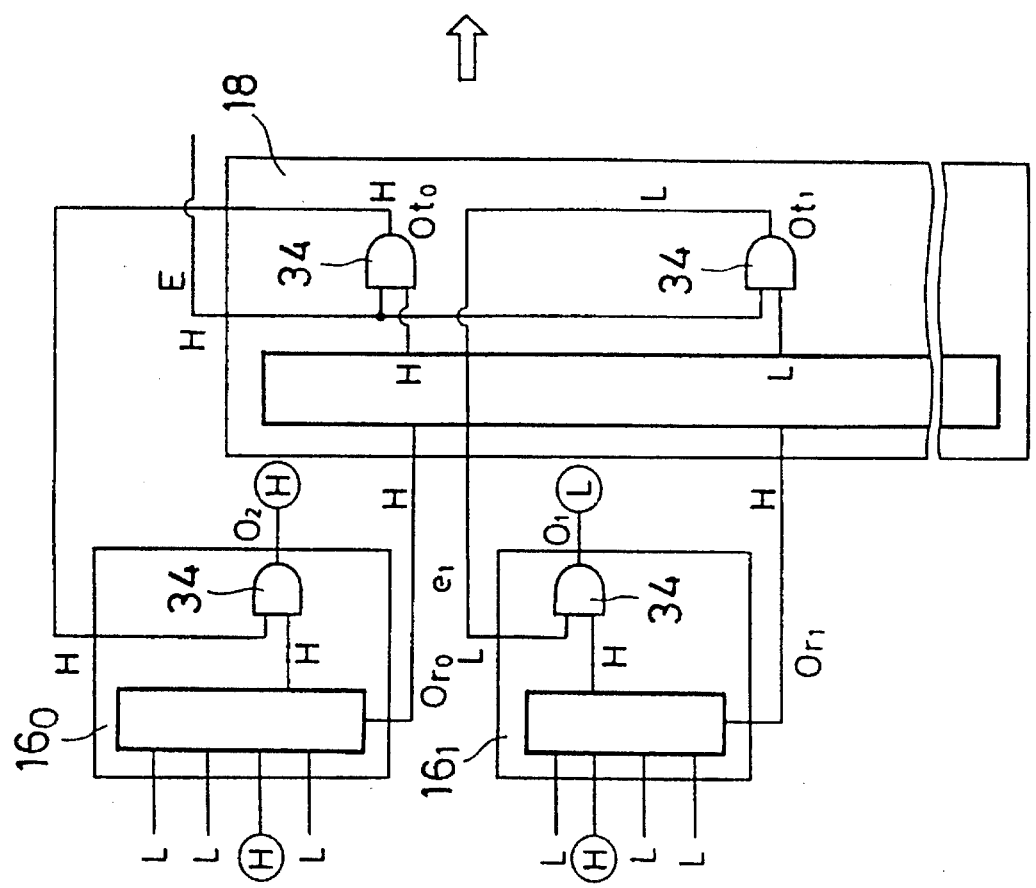

Referring to FIGS. 6(a) and 6(b), a description will subsequently be given of a case where the second priority match signal exists in the other priority circuit on the other hand. Assuming the first priority match signal H exists at the input terminal $I_2$ (third) of the priority circuit $16_0$ of high order and the second priority match signal H (High) exists at the second input terminal of the priority circuit $16_1$ of lower order, the enable signal $e_0$ of the unit circuit $16_0$ is H and from the input $I_2$ of the third circuit element $22_2$ of the unit circuit $16_0$=H, the output of the exclusive OR gate 32 of the logical arithmetic means 30, that is, the input of the AND gate 34 is also H and therefore the output $O_2$ of the AND gate 34 is H likewise. On the other hand, enable signal E is H in the unit circuit 18, input $or_0$ is H and input of the AND gate 34 is H in the first circuit element, thus $e_0$ is H since $Ot_0$ is H. However, input to the AND gate 34 is L (Low) despite input $or_1$=H in the second circuit element, since $Ot_0$ is H in the first circuit element, thus $e_1$ is L since $Ot_1$ is L. From input=H, AND input is H in the unit circuit $16_1$. However, output $O_1$=L and a standby state is held since enable signal $e_1$=L, because of the first priority second circuit element $22_1$.

After the output $O_2$ of the circuit element $22_2$ of the unit circuit $16_0$ is selected and subsequently output as a priority-ordered output signal, the corresponding input $I_2$ is reset and H is changed to L and $I_2$=L. Thus $O_2$=L and from $I_3$=L in addition, $or_0$=L and from the first input $or_0$ of the unit circuit 18=L (even E=H from input to the AND gate 34=L), output $Ot_0$=L. Therefore, the output $Ot_1$ of the second circuit element=H, $e_1$=H and further the output of the second circuit element $22_1$ of the unit circuit $16_1$ is changed to H, whereby the second priority input signal is seen to have been selected. In this manner, priority can readily be altered between different unit circuits by changing the enable signal. Needless to say, assignment of priority within the priority circuits in the at least hierarchical tier of low order is made in parallel plurality at this time to make an increase in operational speed possible. A considerable increase in operational speed can thus be made possible by making parallel assignment of priority in the whole hierarchy.

Figure 7:
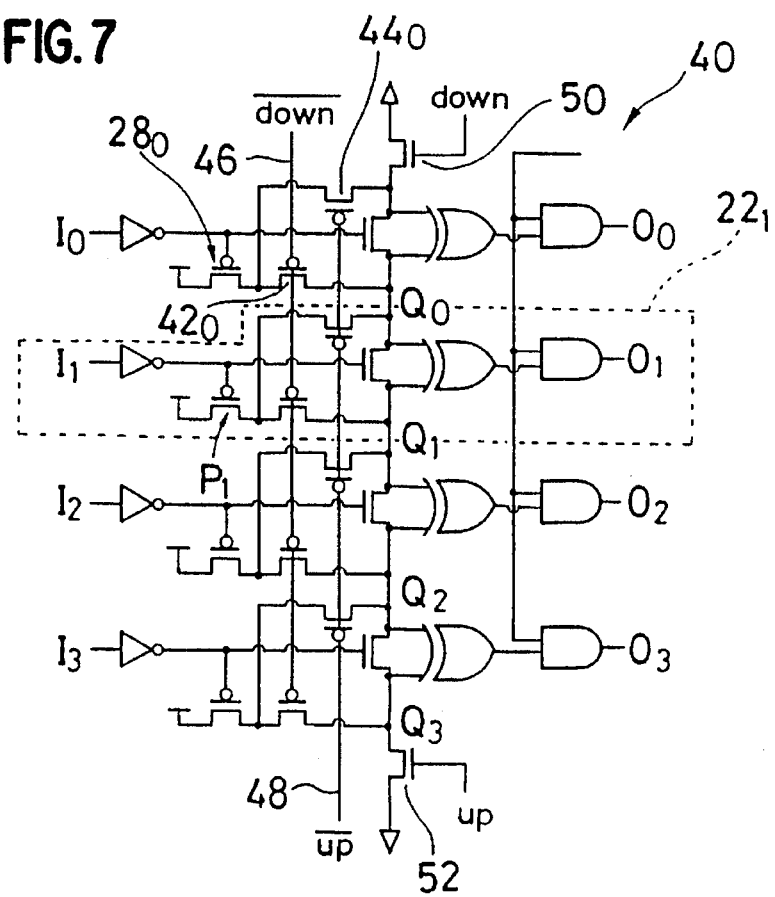
FIG. 7 is a partial block diagram of still another priority circuit for use in the priority encoder according to the present invention.

A priority encoder in the fourth aspect of the present invention will subsequently be described. A priority circuit 40 of FIG. 7, irrespective of the single or multi hierarchical structure, is used as the priority circuit means 12 of a priority encoder in this aspect. As the priority circuit 40 of FIG. 7 is similar in structure to the priority circuit 16 shown in FIG. 2(a) and FIG. 3 except that PMOS transistors 28 ($P_0$, $P_1$, $P_2$, $P_3$) are connected to respective nodes $Q_0$, $Q_1$, $Q_2$, $Q_3$ and that both ends of serially-connected NMOS transistors 26 are grounded via the respective gates, like reference characters are given to like components and the description thereof will be omitted.

In this case, since circuit elements 22 ($22_0$, $22_1$, $22_2$, $22_3$) in the priority circuit 40 are entirely the same in structure, the second circuit element $22_1$ will be described as what represents the priority circuit elements 22 by way of example. The PMOS transistor 28 ($P_1$) is connected via the PMOS transistor 42$_1$ to the node $Q_1$ thereunder and is also connected via the PMOS transistor 44$_1$ to the node $Q_0$ thereabove. Moreover, the gate electrodes of the respective PMOS transistors 42$_0$, 42$_1$, 42$_2$, 42$_3$ connected thereunder are connected to one control signal line 46, whereas the gate electrodes of the respective PMOS transistors 44$_0$, 44$_1$, 44$_2$, 44$_3$ connected thereabove are connected to one control signal line 48. Further, the upper electrode of the uppermost stage NMOS transistor $N_O$ in the priority circuit 40 is grounded (or fixed to "0" potential) via a transistor 50, whereas the lower electrode of the lowermost NMOS transistor $N_3$, that is, the node $Q_3$ is also grounded (or fixed to "0" potential) via a transistor 52.

Figure 8A:
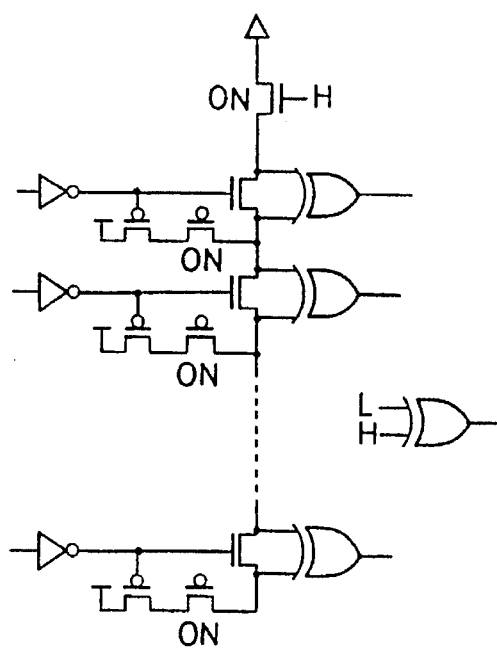
FIGS. 8(a) and 8(b) are diagrams illustrating the operation of the priority circuit of FIG. 7 in different aspects of usage, respectively.
Figure 8B:
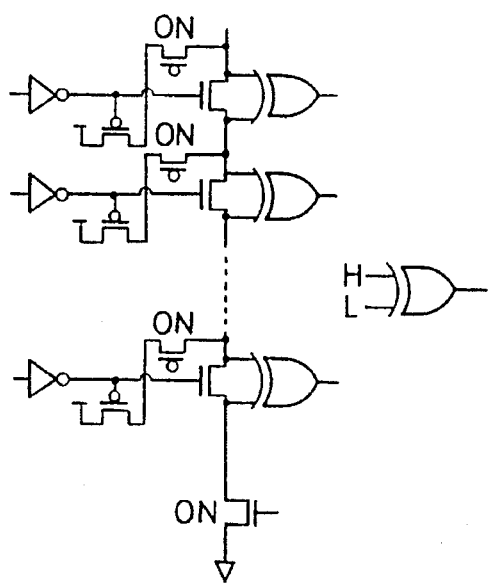

In the priority circuit 40 thus arranged, it is possible, as shown in FIG. 8(*a*), for a propagation control signal "0" to be propagated from top to bottom by turning on the PMOS transistors 42$_0$, 42$_1$, 42$_2$, 42$_3$ as well as the transistor 50 under the control of the control signal line 46, whereby priority is increased in the ascending order. On the other hand, it is also possible, as shown in FIG. 8(*b*), for the propagation control signal "0" to be propagated from bottom to top by turning on the PMOS transistors 44$_0$, 44$_1$, 44$_2$, 44$_3$ as well as the transistor 52 under the control of the control signal line 48, whereby priority is increased in the descending order. The match address can thus be output bidirectionally.

Figure 9:
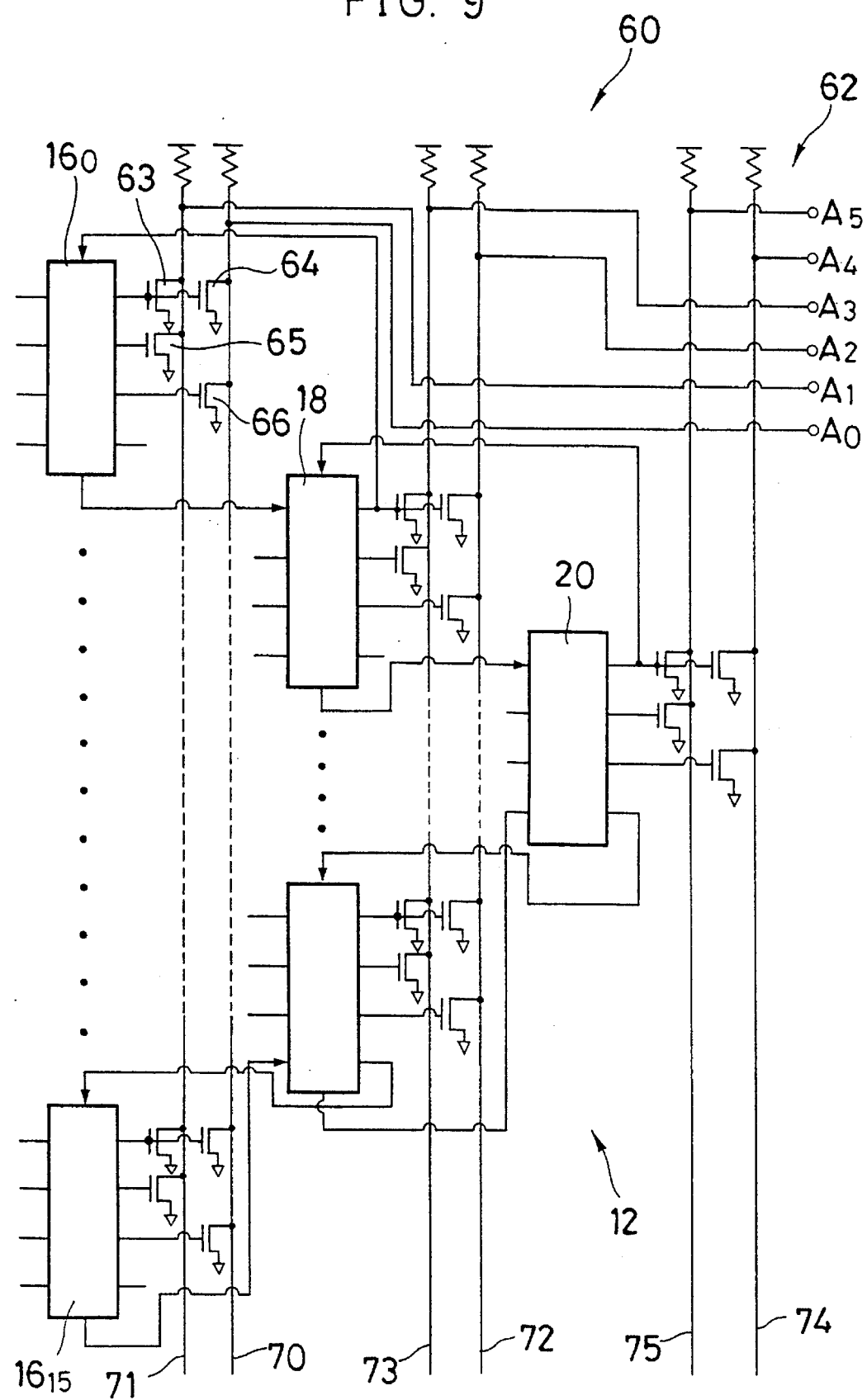
FIG. 9 is a schematic block diagram of another priority encoder according to the present invention.

A priority encoder in the second aspect of the present invention will subsequently be described. FIG. 9 is a block diagram of a priority encoder in this aspect. A priority encoder 60 of FIG. 9 employs the priority circuit means 12 of the priority encoder 10 shown in FIG. 1 and is designed to express bits required in each hierarchical tier without using a conventional address encoder 220 of FIG. 15. More specifically, when the priority circuit means has N hierarchies according to this aspect of the invention, the number of inputs of the small unit priority circuit in the hierarchical tier of the highest order is not greater than $2^a$ ($a \geq 1$), the number of inputs of the small unit priority circuit in the hierarchical tier of the lowest order is not greater than $2^b$ ($b \geq 1$) and the number of inputs of the small unit priority circuit in the intermediate hierarchical tier is not greater than $2^c$ ($c \geq 0$). When the number of intermediate hierarchical tiers is N–2 ($N \geq 2$), an encode circuit is provided in each hierarchical tier so as to encode a bits of highest order, h bits of lowest order and intermediate (N–2)·c bits. In this case, a, b and c pieces of address lines in the respective hierarchical tiers are controlled by the outputs of small unit priority circuits using grounded transistors. The output line of each small unit priority circuit controls the address line using the grounded transistor, depending on the signal state, and cause the address line to represent "0" or "0".

As the priority circuit means 12 of the priority encoder of FIG. 1 has 64 inputs, 6 bits and consequently 6 address lines are needed for the conversion of an address code. When a conventional address encoder is used, a 6-bit address encoder may be formed by connecting the 6 address lines and the respective four output lines of 16 priority circuits 16 in the hierarchical tier of the lowermost order, that is, 64 output lines in total via transistors in the predetermined method. Although the conventional address encoder 220 of FIG. 15 is also applicable to the priority encoder according to the present invention, the number of transistors for connecting the output lines and the address lines increases as that of inputs increases.

The priority encoder 60 in this aspect of FIG. 9 has an address encoder 62 for encoding two bits in each hierarchical tier of the aforementioned priority encoder means 12 of tertiary structure. A priority-ordered output signal is then output when a match signal is contained. However, there exists one output terminal for outputting "1" H (high) in each hierarchical tier out of those forming priority circuits 16, 18, 20 of the priority circuit means 12. Therefore, sixteen priority circuits 16 in the hierarchical tier of the lowest order are connected to two address lines 71, 70 for determining $A_1$, $A_0$ of low order two bits. Four of the priority circuits 18 in the intermediate hierarchical tier are connected to two address lines 73, 72 for determining $A_3$, $A_2$ of intermediate two bits. One priority circuit 18 in the hierarchical tier of the highest order is connected to two address lines 75, 74 for determining $A_5$, $A_4$ of high order two bits.

As one priority circuit and two address lines are connected in the same manner in each hierarchical tier, the connection between the priority circuit 16$_0$ and the two address lines 71, 70 will subsequently be described as a representative example. The first output line $O_0$ of the priority circuit 16$_0$ is connected to the gate electrodes of transistors 63, 64 for respectively grounding (or fixing to "0" potential) the address lines 71, 70. When only the output of the first output line is "1" [($O_0$, $O_1$, $O_2$, $O_3$)=(1, 0, 0, 0)], the transistors 63, 64 are turned on, which results in $A_0 = A_1 = 0$. Then the second output line $O_1$ of the priority circuit 16$_0$ is connected to the gate electrode of a transistor 65 for grounding (or fixing to "0" potential) the address line 71. Consequently, the transistor 65 is turned on only when the second output line $O_1$ is "1" [($O_0$, $O_1$, $O_2$, $O_3$)=(0, 1, 0, 0)], which results in ($A_1$, $A_0$)=(0, 1). Further, the third output line $O_2$ of the priority circuit 16$_0$ is connected to the gate electrode of a transistor 66 for grounding (or fixing to "0" potential) the address line 70. Consequently, the transistor 66 is turned on when only the third output line $O_2$ is "0" [($O_1$, $O_1$, $O_2$, $O_3$)=(0, 0, 1, 0)], which results in ($A_1$, $A_0$) =(1, 0). In this case, ($A_1$, $A_0$)=(1, 1) when only the fourth output line $O_3$ is "1" [($O_0$, $O_1$, $O_2$, $O_3$)=(0, 0, 0, 1)].

The address encoder 62 can be fabricated by carrying out the above-noted connections with the two address lines tier-to-tier in each priority circuit. Since the number of transistors used to connect the address lines 70–75 and the respective priority circuits 16, 18, 20 in this address encoder 62 is four per priority circuit, there are used 84 transistors in total, namely 64 in the tier of the lowest order, 16 in the intermediate tier and 4 in the tier of the highest order. On the contrary, 192 transistors are needed in the case of a conventional address encoder in which all of six address lines are connected to 16 priority circuits 16 in the tier of the lowest order. Consequently, the effect of the high operational speed is obvious in this embodiment.

Figure 10:
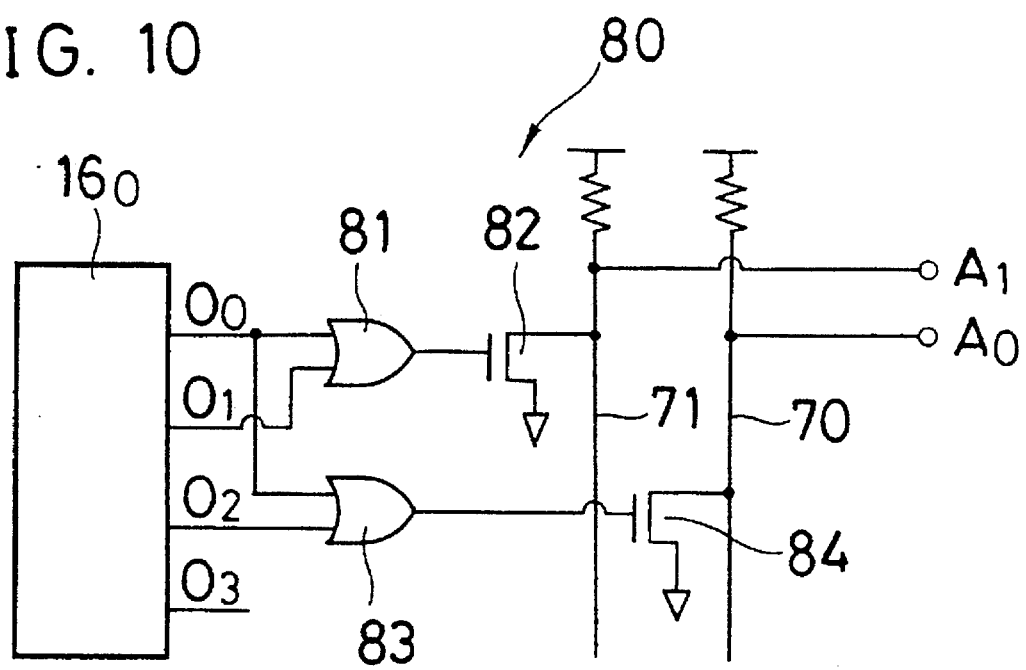
FIG. 10 is a partial block diagram of another priority encoder according to the present invention.

In a priority encoder 80 in the third aspect of the present invention, a subencoder is provided between the output line of the 4-input priority circuit 16 and two address lines 70, 71 as shown in FIG. 10. For example, the first and second output lines $O_0$ and $O_1$ of the priority circuit 16$_0$ are connected to the input of an OR gate 81, whereas the output of the OR gate 81 is connected to the gate electrode of a grounded transistor 82 of the address line 71. On other hand, the first and third output lines $O_0$ and $O_2$ of the priority circuit 16$_0$ are connected to the input of an OR gate 81, whereas the output of the OR gate 82 is connected to a grounded transistor 84 of the address line 70. The use of the subencoder like this can reduce the number of grounded transistors connected to one address line to one at all times. On the contrary, the number of transistors connected to one address line comes up to two, four, eight without the provision of the subencoder if the number of inputs of the priority circuit comes up to four, eight, sixteen inputs. Consequently, the number of grounded transistors connected to the address line is made reducible by providing the subencoder for each priority circuit. An attempt to increase the speed of the encoding operation can thus be implemented.

Figure 17:
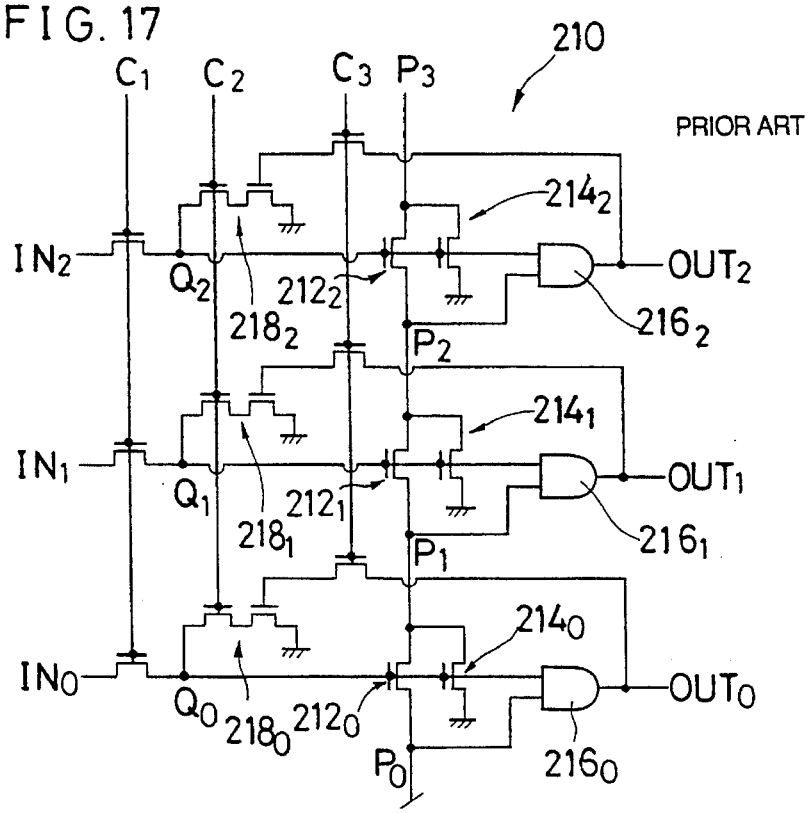
FIG. 17 is a block diagram of a priority circuit in the conventional priority encoder.

A description has been given, by way of example, of an arrangement of N-channel transistors connected serially as priority circuits constituting the priority circuit means of a priority encoder as shown in FIG. 2(a) according to the present invention. However, the present invention is not limited to such an arrangement but includes a hierarchical structure in which serially-connected P-channel transistors constituting priority circuits are used as small unit priority circuits as shown in FIG. 17 and what makes bidirectional priorities possible.

Although priority encoders in various aspects of the present invention has been described, the present invention is not restricted to these aspects but may needless to say be modified in design and improved in numerous ways in connection with the number of inputs or hierarchical tiers of not only priority circuits but also encode circuits without departing the spirit and scope of the present invention.

As set forth above in detail, the priority encoder, in the first aspect of the present invention, for sequentially outputting a plurality of addresses one after another at which match signals are output is simple in structure with a smaller number of elements, operative at high speed and applicable to a large capacity content addressable memory (CAM).

The priority encoder, in the second and third aspects of the present invention, is provided with an address encoder having less transistors connected to address lines than before and is capable of performing high-speed encoding operations.

Moreover, the fourth aspect of the present invention features the capability of assigning priorities bidirectionally, retrieval of data, particularly specific data, from a large capacity CAM and the like with efficiency and retrieval freedom.

Referring to FIGS. 11–14, an encoder embodying the present invention will subsequently be described in detail.

An encoder in the fifth aspect of the present invention is such that when retrieval data is fed to CAM blocks constituting a content addressable memory at the time of match retrieval, the match retrieval is made sequentially from the first one of a plurality Of CAM blocks. At this time, the result in each CAM subblock, that is, a signal matching the retrieval data (a hit signal), is held in each CAM word. A high priority CAM subblock is selected by a priority subblock encode circuit and then the hit signal is transferred to the priority encode circuit. The priority encode circuit encodes the hit signal and outputs a hit address. While the operation of encoding the hit signal is being performed, on the other hand, a hit signal in the second priority CAM subblock selected by the priority subblock encode circuit is applied to a prefetch buffer circuit. The priority encode circuit starts to encode the hit signal in the second priority CAM subblock supplied to the prefetch buffer circuit immediately after the hit signal in the first priority CAM subblock has been encoded completely. Then a hit signal in the third priority CAM subblock is prefetched to the prefetch buffer circuit caused to have a free space. These steps are repeated successively to encode all hit signals in the whole CAM block, that is, to output addresses.

Since a hit signal to be subsequently encoded in the CAM subblock is applied to the prefetch buffer circuit while the hit signal in the preceding content addressable memory is being encoded in the priority encode circuit as stated above, it is unnecessary to provide the time required to transfer the hit signal from the CAM subblock up to the priority encode circuit other than the encoding time. The encoding time to be taken by not only the whole CAM block but also the whole content addressable memory can thus be shortened, whereby the match retrieval operation can be performed by the content addressable memory at high speed.

Referring to the accompanying drawings, the encoder as the preferred embodiment of the present invention will subsequently be described.

Figure 11:
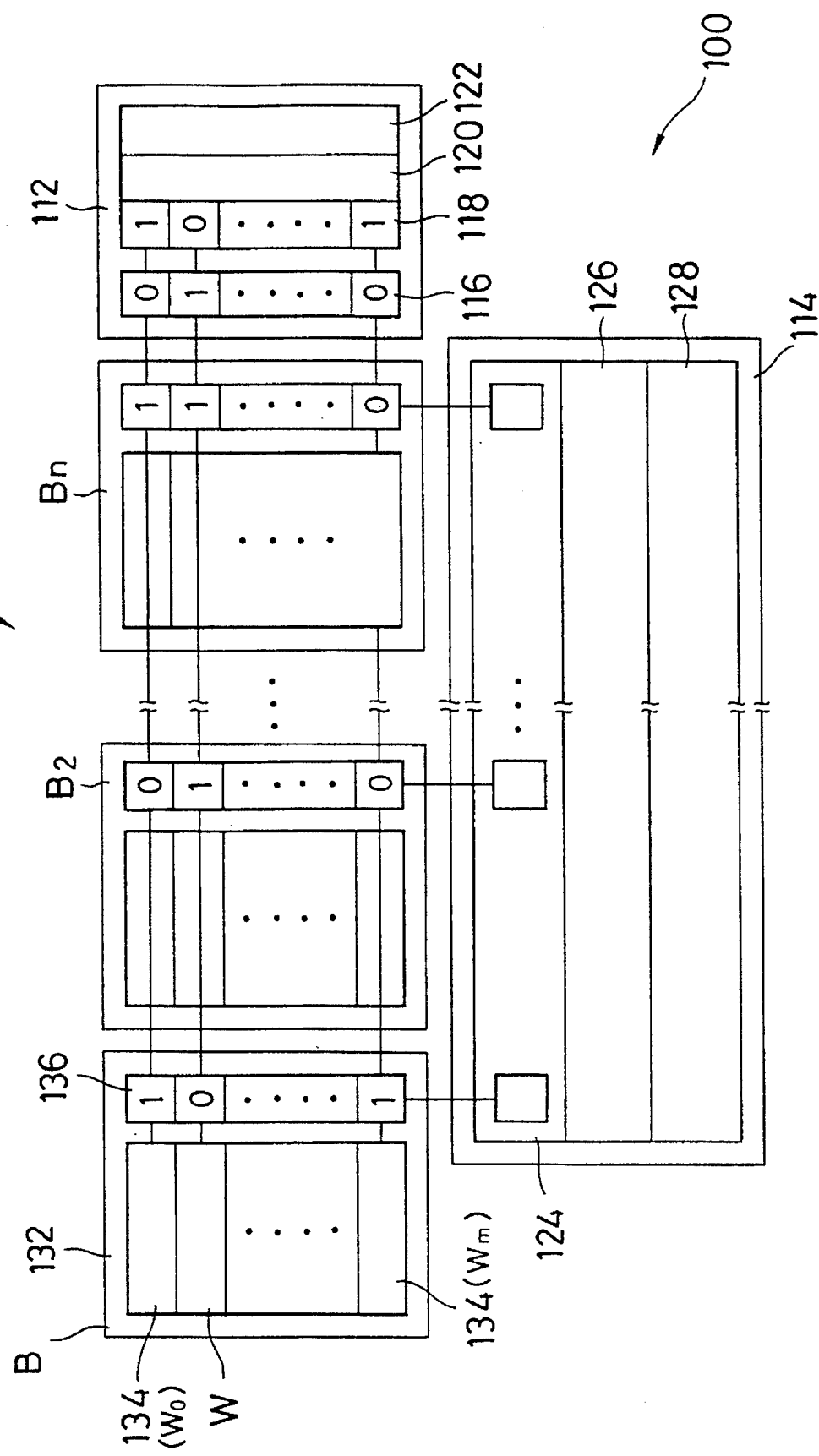
FIG. 11 is a block diagram of an encode circuit applicable to the content addressable memory according to the present invention.

FIG. 11 is a schematic diagram of the encoder applied to a CAM block according to the present invention. As shown in FIG. 11, the encoder 100 according to the present invention comprises a priority encode circuit with a prefetch buffer circuit (hereinafter called 'main priority encoder' or 'main encoder') 112, and a priority subblock encode circuit (hereinafter called 'subblock priority encoder' or 'subblock encoder') 114. The main encoder 112 comprises a prefetch buffer circuit 116, a data latch circuit 118, a priority circuit 120, and an encode circuit 122. The subblock encoder 114 comprises a latch circuit 124, a priority circuit 126, and an encode circuit 128.

The main encoder 112 is provided for a CAM block hereinafter called 'memory block') 130. The memory block 130 comprises a plurality (n pieces in FIG. 11) of CAM subblocks (hereinafter called 'subblock') 132 ($B_1, B_2, \ldots, B_n$). The subblock 132 comprises a subarray (CAM cell subarray) unit having a plurality (m+1 pieces in FIG. 11) of CAM words (hereinafter called 'word') 134 ($W_0, W_1, \ldots, W_m$) where a predetermined number of CAM memory cells are arranged in array, that is, where logical addresses with continuous predetermined word length are provided, registers 136 ($R_1, R_2, \ldots, R_n$) for holding the result of match data retrieval in each word 134, for example, a match "1" signal (hit signal), a mismatch "0" signal in each word 134, and OR circuits for ORing the result of match retrieval (hereinafter called 'hit signal data') in each word 134. The output of the OR circuit is held in the latch circuit 124 of the subblock encoder 114 to be described below on a subblock basis.

Figure 12:
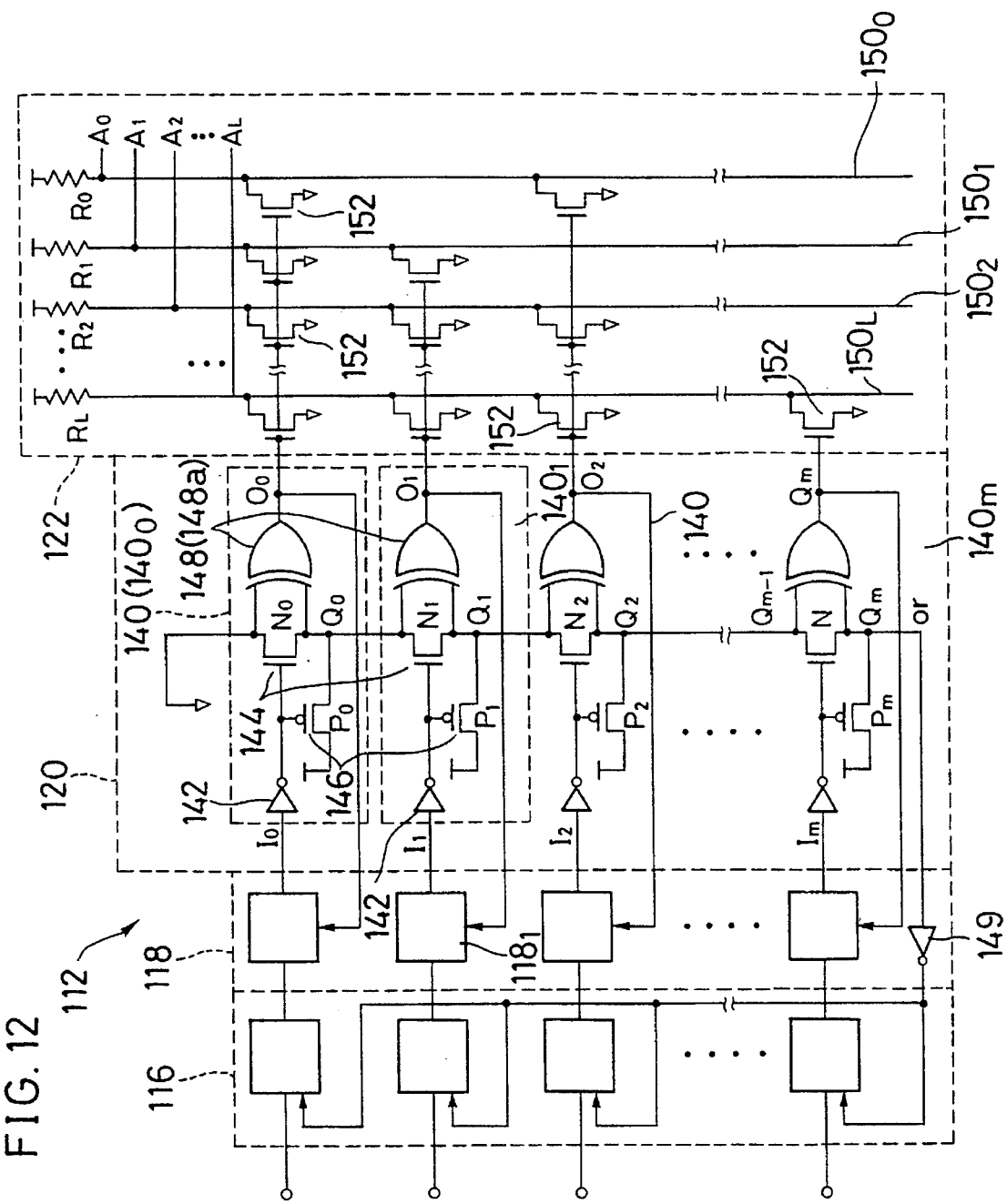
FIG. 12 is a block diagram of a priority encode circuit with a prefetch buffer circuit for use in the encode circuit according to the present invention.

FIG. 12 is a block diagram of the main encoder 112. In FIG. 12, the prefetch buffer circuit 116 of the main encoder 112 stores the hit signal data held in the register 136 of the second priority subblock 132 on a word 134 basis ($W_0, W_1, \ldots, W_m$) while the priority circuit 120 and the encode circuit 122 of the main encoder 112 are encoding the hit signal in the first priority subblock 132 and the address of the match word 134 in the order of predetermined priorities. In this case, the prefetch buffer circuit 116 may be any device such as a data latch circuit or a data register as long as it is capable of temporarily holding m+1 of 1-bit data "0" or "1". After feeding the latch-held hit signal data of each word 134 to the data latch circuit 118 in parallel by means of the encode output (encode address output) of the main encoder 112, the prefetch buffer circuit 116 fetches the hit signal data in the second priority subblock 132 selected by the subblock encoder 114 while the hit signal data is being encoded by the main encoder 112.

As shown in FIGS. 11 and 12, the data latch circuit 118 is used to latch-hold m+1 of 1-bit data like the prefetch buffer circuit 116. While the priority circuit 120 selects data having the hit signal ("1") at one word address from the hit signal data of each word 134 ($W_0, W_1, \ldots, W_m$), particularly what has a plurality of hit signals in the order of predetermined priorities, whereas the encode circuit 122 repeats the encoding operation, the data latch circuit 118 holds the hit signal data until all hit signals ("0") have been encoded. This data latch circuit 118 is so arranged that each time the hit signal ("1") at a high priority word address is encoded, the hit signal ("1") at that word address is reset.

When a hit signal data having a plurality of hit signals is applied as shown in FIG. 12, that is, on receiving m+1 of input signals of the whole word 134 having a plurality of match signals, the priority circuit 120 sequentially outputs an output signal including only one priority-ordered hit signal as designated in the order of predetermined priorities, thus including m+1 of priority circuit elements ($140_0$, $140_1$, ..., $140_m$). In this case, the second circuit element (hereinafter simply called 'circuit element') $140_1$ will be described as what represents the priority circuit elements 140 by way of example. The circuit element comprises an invertor 142 for inverting the input signal applied to the input terminal $I_1$, an N-channel MOS transistor 144 ($N_1$), a P-channel MOS transistor 146 ($P_1$), the output of the invertor 142 being connected to the gate electrodes of both transistors 144, 146 which are mutually exclusively controlled by the input signal, and a logical arithmetic circuit 148 with the source and drain electrodes of the NMOS transistor 144 as inputs and with the output terminal $O_1$ as an output.

One electrode (e.g., the source electrode) of the NMOS transistor $N_1$ is connected to the other electrode (e.g., the drain electrode) of the NMOS transistor $N_O$ of the circuit element $140_0$ of higher order at a node $Q_0$, whereas the other electrode (e.g., the drain electrode) of the NMOS transistor $N_1$ is connected to one electrode (e.g., the source electrode) of the NMOS transistor $N_2$ of the circuit element $140_2$ of lower order at a node $Q_1$. The NMOS transistors $N_0$, $N_1$, $N_2$, ..., Nm are thus connected serially at nodes $Q_0$, $Q_1$, $Q_2$, ..., Qm−1. A node $Q_m$ under the NMOS transistor $N_m$ is connected to the OR output terminal or and this OR output terminal or is connected via an invertor 149 to each circuit of the prefetch buffer circuit 116. Moreover, the electrode (e.g., the source electrode) above (on one side of) the NMOS transistor $N_O$ of the uppermost stage is fixed to the potential (the signal state) indicating "0" or grounded. On the other hand, one electrodes (e.g., the source electrodes) of the respective PMOS transistors $P_0$, $P_1$, $P_2$, ..., $P_m$ are fixed to the potential (the signal state) indication "1" or connected to a power supply $V_{pp}$, whereas the other electrodes thereof (e.g., the drain electrodes) are connected to the respective nodes $Q_0$, $Q_1$, $Q_2$, ..., $Q_m$. In this case, the direction of the connection of the electrodes (the source and drain electrodes) between the NMOS transistors may be reversed on condition that the NMOS transistors $N_0$, $N_1$, $N_2$, ..., $N_m$ are connected in series; the same will apply to the PMOS transistors $P_0$–$P_m$. The priority circuit 120 having m+1 inputs and m+1 outputs is formed in this way.

A description will subsequently be given of the operation of assigning priority in the priority circuit 120, that is, the operation of outputting a priority-ordered output signal with only the first priority address as a match signal "1" even though a plurality of hit signals (match signals) "1" are applied from $I_0$–$I_m$. When attention is riveted to the circuit element $140_1$ of the priority circuit 120, the $N_1$ transistor 144 is turned off and the $P_1$ transistor 146 is turned on if an $I_1$ input is 1. Therefore, the $Q_1$ node is set at 1 by the $P_1$ transistor 146. If an $I_1$ input is 0, the $N_1$ transistor 144 is turned on and the $P_1$ transistor 146 is turned off. Therefore, the logical value of the $Q_1$ node becomes equal to that of the $Q_0$ node higher by one level. If an $I_k$ input is 1, $Q_k$ becomes 1 and consequently $Q_j(j \geq k+1)$ can be exclusively 1, irrespective of whether $I_j$ is 1 or 0. In other words, (the signal state of) a node $Q_{k+}^1$ is 1 if $I_{k+1}=1$ and $Q_{k+1}=Q_k$ if $I_{k+1}=0$ and further $Q_{k+1}=1$ from $Q_k=1$.

As a result, with a plurality of I inputs being 1 in FIG. 12, "0" representing a propagation control signal is transmitted up to the NMOS transistor 144 located on the uppermost side while the corresponding serially-connected NMOS transistors 144 (N) remain off. However, the propagation control signal "0" is not transmitted to each lower Q node and 1 is retained in all the lower Q node. Consequently, the logical arithmetic circuit 148 may be used to detect the extent to which the control signal "0" has been transmitted. When all m+1 inputs of $I_0$–$I_m$ of the priority circuit 120 become "0", the control signal "0" is transmitted up to the OR output terminal or and the absence of "1" in all m+1 input signals is made known. The termination of assigning priority to all the hit signals of the hit signal data in this subblock makes it known that the second priority hit signal data latch-held in the prefetch buffer circuit 116 can be fed to the data latch circuit 118 and that the third priority hit signal data selected by the subblock encoder 114 can be read to the prefetch buffer circuit 116 then.

As shown in FIG. 12, the logical arithmetic circuit 148 comprises an exclusive OR gate (mismatch circuit) 148a for exclusively ORing the signal state between the drain and source of the serially-connected NMOS transistor 144 ($N_1$), that is, the logical value between the nodes $Q_0$ and $Q_1$. In this logical arithmetic circuit 148, when the nodes $Q_0$ and $Q_1$ mismatch, that is,the propagation control signal "0" has propagated up to the node $Q_0$ of the NMOS transistor 144 ($N_1$) of the circuit element 140, but has not been propagated up to the node $Q_1$, the exclusive OR gate 148a outputs "0". When the nodes $Q_0$ and $Q_1$ match, the output of the output terminal $O_1$ is "0". The logical arithmetic circuit 148 is not limited in configuration to the example shown in FIG. 12 but may be so arranged as to perform desired logical operations with a combination of various gates. Moreover, the input of the logical arithmetic circuit 148 need not necessarily be applied between the nodes $Q_0$ and $Q_1$ but may be either one of them and an input signal or its inverted value and besides the contents of the logical operation may be selected properly in accordance with the signal value.

When the first priority-ordered output signal (O) having one hit signal is output from an input signal (I) having a plurality of hit signals, the first priority output signal should be used to reset the input side in a case where the address of the second priority match signal exists in the same subblock 132. In other words, assuming $I_1=1$, $I_2=1$ in the priority circuit 120 of FIG. 12, for example, output $O_1=1$ since node $Q_0=0$, node $Q_1=Q_2=...=Q_m=1$. If the $O_1$ output value is input to the reset terminal of the data latch circuit 118, $I_1=0$ and therefore the N transistor 144 ($N_1$) is turned on, whereas the P transistor 146 ($P_1$) is turned off, and node $Q_1=Q_0=0$. Since the N transistor $N_2$ is held OFF, node $Q_0=Q_1=0$, node $Q_2=...=Q_m=1$. The second priority $I_2=1$ is then selected as the next output signal.

The plurality of hit signals within the hit signal data in the same subblock 132 are applied to the main encoder 112 at a time and the hit signals are sequentially applied to the encode circuit 122 by the priority circuit 120 as an output signal having only one hit signal in the order of predetermined priorities. Then "1" is applied to the reset terminal of the data latch circuit 118 of the word address corresponding to the "1" output and the hit signals ("1") latch-held in the data latch circuit 118 are sequentially reset. When the last priority-ordered hit signal is applied to the encode circuit 122 and applied to the encode circuit 122 before being reset, data "0" is transmitted to the lowermost node $Q_m$ of FIG. 12 before being output from the OR output terminal or. Further, the data "0" is inverted by the invertor 149 and its inverted value "1" is applied to the whole prefetch buffer circuit 116. After the hit signal data in the second priority subblock 132 thus latch-held is applied (shifted) to each corresponding circuit of the data latch circuit 118 and held therein, the hit signal data in the third priority subblock 132 preselected by the subblock encoder 114 is read from the register 136 to the prefetch buffer circuit 116 having a free space and latch-held. The priority circuit 120 thus terminates the processing of the hit signal data in the first priority subblock and since it need not wait for the hit signal data in the second priority subblock transferred from the register 136 of the subblock 132, it can perform the encoding operation with efficiency.

The encode circuit 120 is used to encode only one match signal address existing in the output signals sequentially output from the priority circuit 118 and to encode each word address at the output terminal $O_0, O_1, O_2, \ldots, O_m$ corresponding to each of the words 134 ($W_0, W_1, W_2, \ldots, W_m$). The encode circuit 120 comprises L+1 of address lines 150 ($150_0, 150_1, 150_2, \ldots, 150_L$) for encoding L+1 bits with respect of the smallest natural number L which comes up to $m+1 \geq 2^L$, and grounded transistors 152 affixed to each address line 150, whereas each gate electrode of them is connected to the output line from each of the output terminals $O_0, O_1, O_2, \ldots, O_m$. In this case, one ends of the respective L+1 address lines $150_0, 150_1, 150_2, \ldots, 150_L$ are connected via respective resistors $R_0, R_1, R_2, \ldots, R_L$ to a power supply (or fixed to "1" potential) and the transistor 152 is so installed as to make L+1 code outputs of $A_L \ldots A_2 A_1 A_0$ available.

The output line from the output terminal $O_0$ is connected to all the gate electrodes of L+1 grounded transistors 152 connected to all L+1 address lines $150_0$–$150_L$. When the output of the output terminal $O_0$ is, for example, "1" (match signal) and when the remainder is all "0", $A_L = \ldots = A_2 = A_1 = A_0 = 0$, thus indicating ($A_L \ldots A_2 A_1 A_0$)=(0 ... 0 0 0). Subsequently, the output terminals $O_1$ and $O_2$ corresponding to the second and third word addresses $W_1$ and $W_2$ are respectively connected to the gate electrodes of L pieces of the grounded transistors 152 connected to L pieces of address lines $150_1$–$150_L$ and $150_0, 150_2$–$150_L$ excluding the address lines $150_0$ and $150_1$, respectively. Only when the output terminals $O_1$ and $O_2$ become "1", they respectively represent ($A_L \ldots A_2 A_1 A_0$)=(0 ... 0 0 1) and (0 ... 0 1 0). Thereafter, the grounded transistor 152 is connected to each address line 150 in such a way as to represent each code address likewise. When $m+=2^L$, for example, the output line of the last output terminal $O_m$ is connected only the grounded transistor 152 fitted to the address line $150_L$ and only when the output terminal $O_m$ is 1, it represents ($A_L \ldots A_2 A_1 A_0$)=(0 1 ... 1 1 1) (the initial L+1 digit represents 0 and the remainder L all 1). When all output terminals $O_0, O_2, \ldots, O_m$ is "0", it represents ($A_L \ldots A_2 A_1 A_0$)=(1 ... 1 1 1) (all 1). The encode circuit 122 is basically thus arranged. The encode circuit 122 is limited to what has been illustrated but may be any other known circuit of the sort that is capable of encoding and outputting the "1" output address on receiving an input signal having the "1" output at only one word address.

Figure 13:
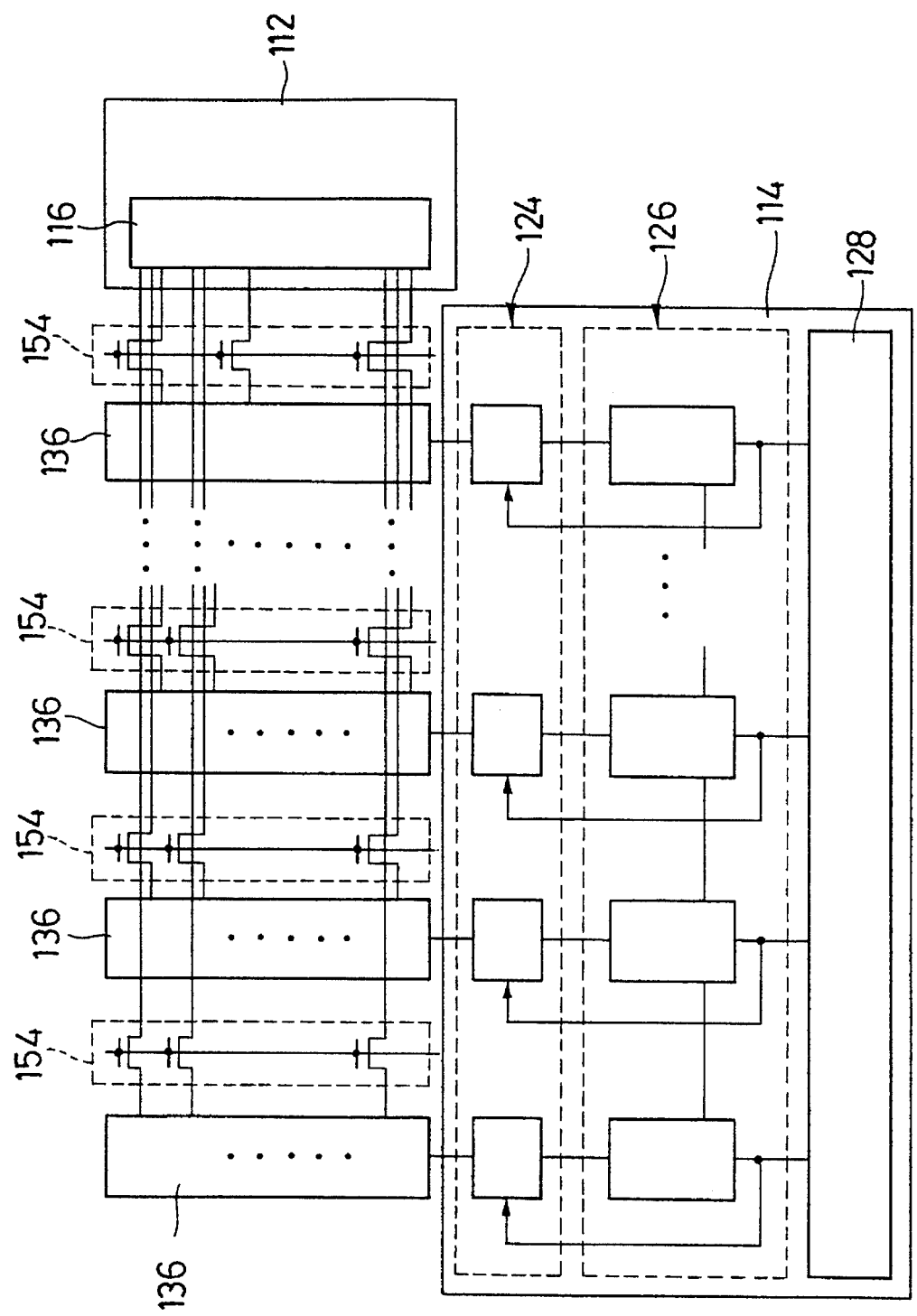
FIG. 13 is a block diagram of a priority subblock encode circuit for use in the encode circuit according to the present invention.

FIG. 13 is a block diagram of the subblock encoder 114. As the data latch circuit 124, the priority circuit 126 and the encode circuit 128 shown in FIG. 13 are substantially similar in structure to the data latch circuit 118, the priority circuit 120 and the encode circuit 122 shown in FIG. 12 except that the number of units constituting each of them is m+1 instead of n, a detailed description of their circuit arrangements will be omitted. The result of match retrieval in each memory subblock 132, that is, hit signal data is held in the register 136 at the time of match retrieval carried out in each CAM memory subblock 132 ($B_1, B_2, \ldots, B_n$). Moreover, an OR circuit (not shown) in the subblock 132 causes a subblock hit signal indicating the presence or absence of the word 134 (hit word or match word) showing match retrieval data to be generated and held in the data latch circuit 124 of the corresponding subblock 132. Match retrieval is sequentially is carried out in the subblock 132 and the block hit signal is latch-held in the data latch circuit 124 when the hit signal data is held in the register 136 of the relevant subblock 132.

On the other hand, the subblock 132 whose the block hit signal latch-held in the data latch circuit 124 is the hit signal ("1") is selected in the order of predetermined priorities, from left to right in FIG. 13, in the priority circuit 126 of the subblock encoder 114 and the priority-ordered output signal having "1" is applied to only that block address. The encode circuit 128 of the following stage encodes the output signal and while the main encoder 112 is encoding and outputting the word address of the hit signal data in the relevant subblock 132, causes the word address to be encoded and output continuously as a block address. In the meantime, the gate circuit 154 in the control unit of the second priority subblock 132 having the block hit signal ("1") is selected by making the block selection line active to turn it on and the hit signal data in the register 136 is fed to the prefetch buffer circuit 116 having a free space in the main encoder 112.

The subblock encoder 114 selects the priority subblock 132 to be encoded next in the order of predetermined priorities in this way and while the main encoder 112 is encoding the word address of the hit signal from the hit signal data in the first priority subblock 132, and transfers the hit signal data in the second priority subblock 132 to the prefetch buffer circuit 116 having a free space and has the data latch-held.

Figure 18:
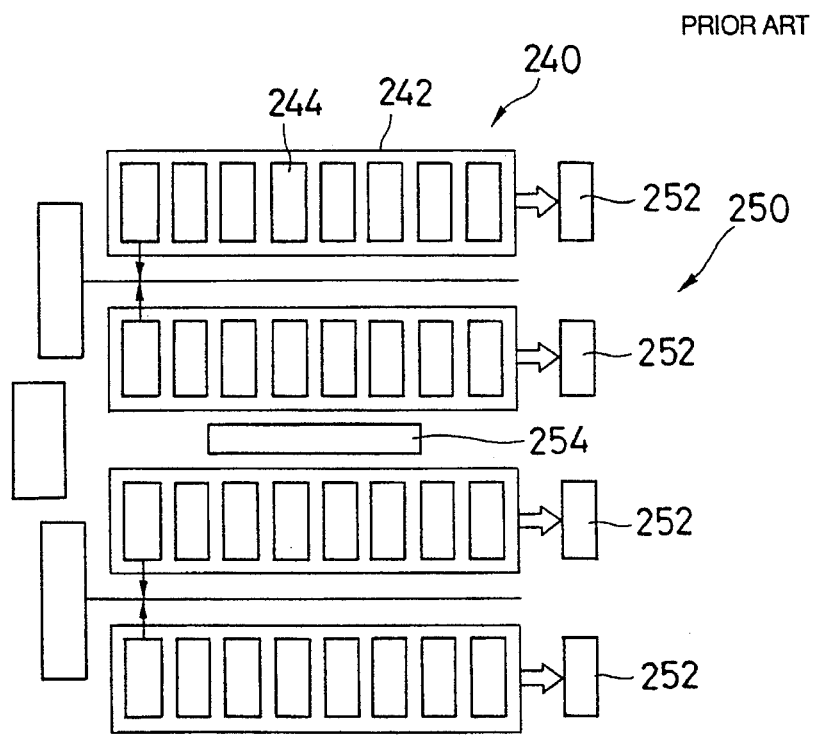
FIG. 18 is an overall block diagram of a content addressable memory to which the conventional encode circuit is applied.
Figure 19:
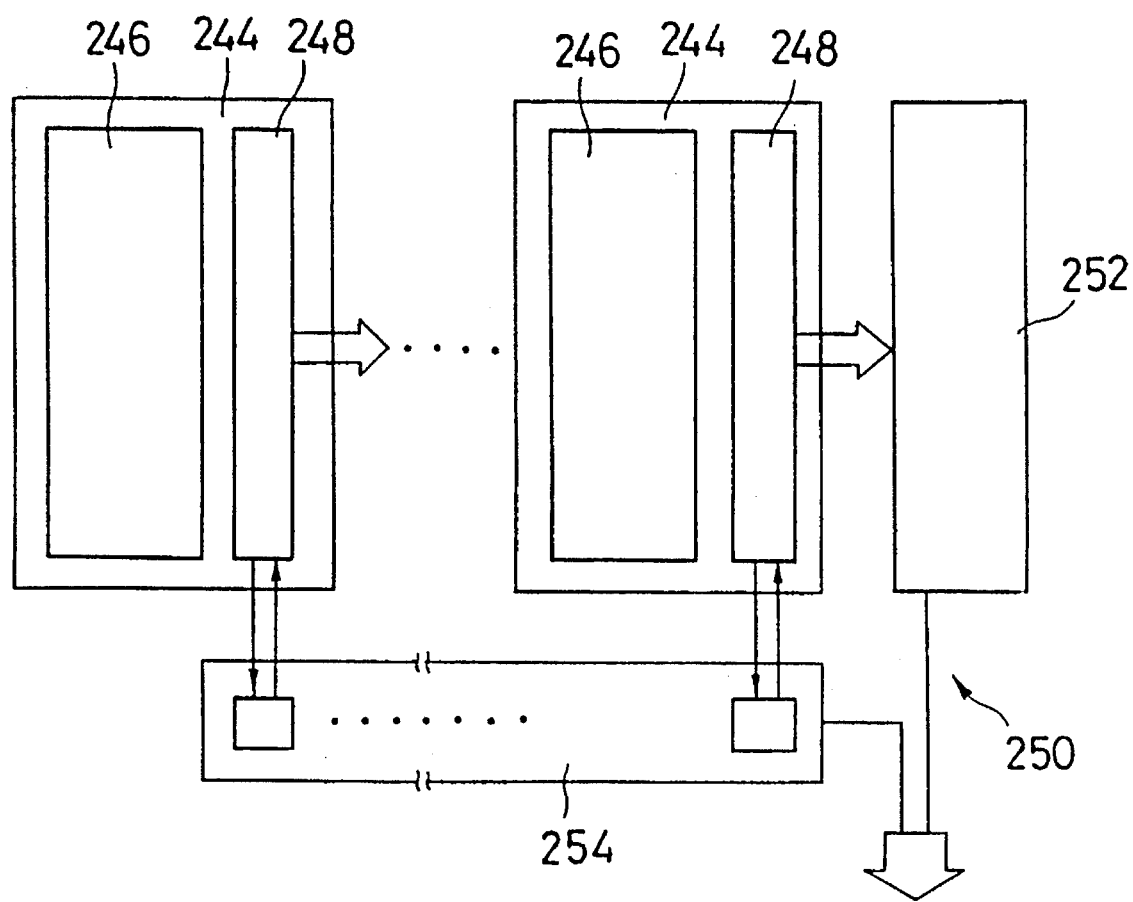
FIG. 19 is an overall block diagram of a CAM block to which the conventional encode circuit is applied.

The encoder 100 according to the present invention combines the encoded block address output from the encode circuit 128 of the subblock encoder 114 and the encoded word address output from the encode circuit 122 of the main encoder 112 into an encode logical address and sequentially output the result. When the last subblock 132 or the lowest priority subblock 132 is selected, the process in the subblock encoder 114 is terminated and when the operation of encoding whole hit signal by the main encoder is terminated, the encoder 100 outputs the hit signals of all memory words in the CAM subblock 130 as logical addresses and terminates the match retrieval operation. Although the present invention refers to the encoder 100 having one main encoder 112 and one subblock encoder 114 with respect to the CAM block 130 having the plurality of CAM subblocks 132 by way of example, the present invention is not limited to this example but may be so arranged as to have one subblock encoder 114 with respect to a plurality of CAM blocks 130 like a conventional encoder 210 applicable to the CAM 200 shown in FIG. 18.

Figure 14:
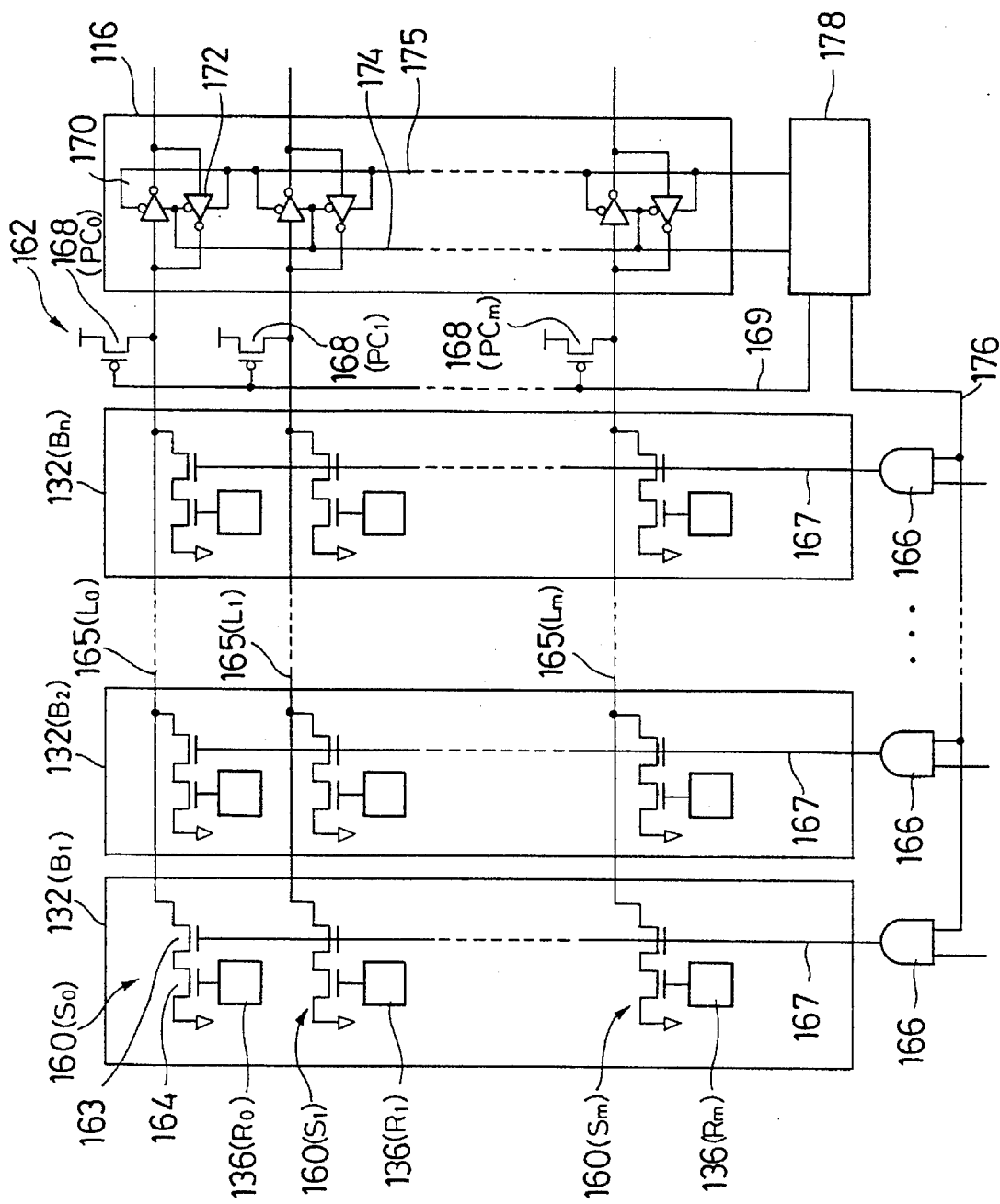
FIG. 14 is a block diagram of the prefetch buffer circuit of the encode circuit according to the present invention.

FIG. 14 shows a specific circuit arrangement of the prefetch buffer circuit 116 used in the encoder 100 according to the present invention together with a switch circuit 160 for controlling each subblock 132 required for the operation thereof and a precharge circuit 162.

A description will be given of one switch circuit 160 ($S_O$) connected to the register 136 ($R_0$) of a subblock 132 ($B_1$) by way of example. The switch circuit 160 ($S_0$) comprises two NMOS transistors 163, 164 connected in series. The electrode (e.g., the drain electrode) of one transistor 163 of each switch circuit 160 ($S_0, S_1, \ldots, S_m$) is connected in parallel to a corresponding input line 165 ($L_0, L_1, \ldots, L_m$) in each subblock 132 ($B_1, B_2, \ldots B_n$), whereas a detection line L is connected to the prefetch buffer circuit 116. The gate electrode of the transistor 163 of each switch circuit 160 ($S_0, s_2, \ldots S_m$) is connected in parallel to a block selection line 167 and to an AND circuit 166. Moreover, the gate electrode of the other transistor 164 of each switch circuit 160 ($S_0, S_1, \ldots, S_m$) is connected to the output terminal of the corresponding register 136 ($R_0, R_1, \ldots, R_m$), whereas the other electrode (e.g., the source electrode) of the transistor 164 is grounded. Further, the precharge circuit 162 comprises a PMOS transistor 168 ($PC_0, PC_1, \ldots PC_m$) as a precharge transistor for precharging the input line 165 ($L_0, L_1, \ldots, L_m$) at a predetermined potential (e.g., power supply potential). One electrode of each PMOS 168 ($PC_0, PC_1, \ldots PC_m$) is connected to a fixed potential source (power supply), the other electrode to the input line 165 ($L_0, L_1, \ldots, L_m$) and the gate electrode to a precharge signal line 169.

The prefetch buffer circuit 116 has (m+1) of data latch circuits, each comprising two invertors 170, 172 connected reversely in parallel and latch signal lines 174, 175 for receiving a control signal for controlling the output state of the invertors 170, 172. The input side ends of the invertors 170, 172 connected in parallel are connected to the input line 165 ($L_i$), whereas the output side ends thereof are connected to circuit elements corresponding to the data latch circuit 118. Moreover, the latch signal line 174 is connected to the control signal terminal of the invertor 170 and the inverted control signal terminal of the invertor 172, whereas the latch signal line 175 is connected to the control signal terminal of the invertor 172 and the inverted control signal terminal of the invertor 170.

One input terminal of the AND circuit 166 is connected to a circuit element corresponding to the data latch circuit 124 (or the priority circuit 126) of the subblock encoder 114, whereas the other input terminal thereof is connected to a control signal line 176 for controlling the selection timing of the block selection line. The control signal line 176, the precharge signal line 169, the latch signal lines 174, 175 are connected to a timing control circuit 178 for controlling the operating timing of each circuit.

The prefetch operation of the prefetch buffer circuit 116 will subsequently be described.

First, all PMOS 168 ($PC_0, PC_1, \ldots, PC_m$) are turned on with the precharge signal line 169 as L and (m+1) of input lines 165 ($L_0, L_1, \ldots, L_m$) of the prefetch buffer circuit 116 are precharged at a predetermined potential. Subsequently, the timing control circuit 178 is operated to turn off (m+1) of PMOS 168 with the precharge signal line 169 as "0" (H). With the control line 176 as "1" (H) further, the block hit signal "1" of the second priority (the next priority of the subblock in which the main encoder 112 is performing the encoding operation) subblock 132 ($B_i$) with the block hit signal "0" latch-held in the data latch circuit 124 of the subblock encoder 114 is applied to the AND circuit 166. Then the block selection line 167 of the relevant subblock 132 ($B_i$) is turned on.

When the second priority subblock 132 ($B_i$) is selected so as to make the corresponding AND circuit 166 set and the block selection line 167 at H (high level), the transistor 164 whose gate electrode has been connected to the register 136 ($R_j$) holding the hit signal ("1") out of the registers 136 and the transistor 163 connected thereto are turned on. These transistors 164, 163 operate to ground the input line 165 ($L_j$) and lower the potential of the input line by pulling out the precharged charge of the input line 165 ($L_j$). On the other hand, the transistor 164 whose gate has been connected to the register 136 ($R_j$) holding data of "0" (mismatch) is not turned on but remains off, whereby the potential of the corresponding input line 165 ($L_j$) is left unchanged even though the block selection line is set at H. The precharged potential is maintained.

Consequently, the potential of the input line 165 ($L_0, L_1, \ldots, L_m$) varies with the value ("1": hit signal, "0": mishit signal) stored in the register 136 of the selected subblock 132 ($B_i$), thus inverting the polarity.

By giving the latch signal lines 174, 175 of the prefetch buffer circuit 116 latch signals, the parallel-connected invertors 170, 172 of the prefetch buffer circuit 116 are made to latch the signal. In this case, the input lines on the input side of the invertors 170, 172 become equal though these lines are opposite, in polarity to the register 136, because their output sides are inverted. Consequently, the hit signal data in the next subblock 132 latched by the prefetch buffer circuit 116 is fed to the data latch circuit 118 simultaneously when the encoding operation in the first priority subblock 132 of the main encoder 112 is terminated. Then the prefetch buffer circuit 116 repeats the aforementioned operation in order to prefetch the hit signal data in the storage register 136 of the further next priority subblock 132.

The encoder 100 according to the present invention is basically arranged like this.

The encoder according to the present invention is not limited to what comprises the priority circuits 120, 126 and the encode circuits 122, 128 shown in FIGS. 12, 13 but may employ priority circuits and encode circuits that have conventionally been known in addition to the priority means of the priority encoders stated in the first to fourth aspect of the present invention and the encoder means to speed up the operation of assigning priority and the encoding operation itself.

With respect to the priority circuit 120 or 126, for example, use can be made of priority circuit means 12 having a hierarchical structure of FIG. 1 or 9, or otherwise the encode circuit 62 of FIG. 9 as the encode circuit 122 or 128. It is needless to say feasible to use the combination of the priority circuit and the encode circuit in various ways.

Although a description has been given of the serially-connected N-channel transistors of FIG. 12 as priority circuits constituting the main encoder and the subblock encoder of the encoder by way of example, the present invention is not limited to the example above but may be so arranged as to use serially-connected P-channel transistors to form such a priority circuit, to make bidirectional priority assignment possible, or to employ heretofore known main encoders and subblock encoders provided a prefetch buffer circuit is used as the main encoder.

Although encoders in various aspects of the present invention has been described, the present invention is not restricted to these aspects but may needless to say be modified in design and improved in numerous ways in connection with the number of inputs and arrangements of prefetch buffer circuits, data latch circuits, priority circuits and encode circuits constituting the main encoder and the subblock encoder without departing the spirit and scope of the present invention.

As set forth above in detail, when the match retrieval data in the CAM memory block is obtained by means of the encoder according to the present invention, the result of match retrieval in the first CAM subblock among the plurality of CAM subblocks constituting the CAM block, for example, a match signal (hit signal) matching the retrieval data in the plurality of CAM words is held in the holding means such as a register and the block hit signal (indicating the presence of the CAM word matching the retrieval data) is generated in the CAM subblock. On receiving a block hit signal, the priority subblock encoder subsequently selects the first priority CAM subblock and generates a subblock address. The hit signal (simultaneously over the whole word) in the first priority subblock thus selected is transferred to the priority encoder. Then the priority encoder encodes the hit signal in the order of predetermined priorities and outputs a word address. The priority subblock encoder selects the second priority CAM subblock during the encoding operation above and applies the hit signal data held in the holding means such as the register of the subblock to the prefetch buffer circuit provided in the main priority encoder. Accordingly, the main priority encoder starts encoding the hit signal data in the second priority subblock stored in the prefetch buffer circuit immediately after the hit signal has been encoded completely and outputs the word address. Then the encoder combines the word address output with the subblock address output and outputs a logical address.

According to the present invention, output signals from a number of CAM subblocks can be encoded efficiently without delay (switch time) at the time of subblock-to-subblock switching even when the plurality of subblocks constitute a CAM block. As a result, the encoder according to the present invention is applicable to a large capacity content addressable memory which has the CAM block comprising the plurality of CAM subblocks and is required to process large capacity data at high speed.

What is claimed is:

1. A priority encoder having priority means for selecting one active input signal supplied to one input terminal at one address according to a predetermined priority order among active input signals supplied to input terminals at least at two addresses, and for producing output signals including only one active signal to be encoded corresponding to said selected active input signal, and for sequentially producing the output signals in said predetermined priority, order by selecting said active input signals one after another, and encode means for receiving said output signals including only one active signal to be encoded of said priority means as inputs, and for encoding the address of the input terminal which said selected active input signal is supplied to, said priority means is formed into a hierarchical structure having at least two hierarchies by using a plurality of small unit priority circuits which output an OR output as a logical sum signal of input signals less than said plurality of input signals, and which activate and output only an output signal corresponding to an active highest priority input signal in output signals corresponding to 1 to 1 to said input signals less than said plurality of input signals when an enable signal is active, and said OR output of the plurality of the small unit priority circuits in a lower hierarchy is the input signal to the small unit priority circuits in a higher hierarchy, and the output signals of the small unit priority circuits in the higher hierarchy are the enable signals to the plurality of small unit priority circuits in the lower hierarchy, and priority is concurrently assigned to the small unit priority circuits in the same hierarchy.

2. The priority encoder as claimed in claim 1, wherein said small unit priority circuit comprises a plurality of priority circuit element arrays and wherein each priority circuit element array comprises signal input terminals, a first switch circuit for generating a propagation control signal toward a preceding or following priority circuit element array by means of an input signal applied to an input terminal, a second switch circuit for propagating the propagation control signal propagated from the following or preceding priority circuit element array to another preceding or following priority circuit element array, said second switch circuit being exclusively controlled by said input signal with respect to said first switch circuit, and logical arithmetic means for performing logical operations on one propagation control signal and said input signal and for outputting a result when said enable signal is activated.

3. The priority encoder as claimed in claim 2, wherein each small unit priority circuit makes said propagation control signal said OR output, said propagation control signal being output from the priority circuit element array of a lowest or highest order.

4. The priority encoder as claimed in claim 1, wherein each small unit priority circuit further comprises means for directly performing arithmetic operations on all of said input signals applied and outputting a result as an OR output.

5. The priority encoder as claimed in claim 1, wherein said priority means has an N hierarchy, and wherein assuming the number of inputs in the small unit priority circuit in the highest hierarchy is $2^a$ ($a \geq 1$), the number of inputs in the small unit priority circuit in the lowest hierarchy is $2^b$ ($b \geq 1$), and the number of inputs in each small unit priority circuit in an intermediate hierarchy is $2^c$ ($c \geq 0$), said intermediate priority circuit being in an (N–2 ($N \geq 2$)) hierarchy, said encode means are provided with an encode circuit of a highest order affixed to $2^a$ outputs of a priority circuit in the highest hierarchy and used for encoding the highest order, a, bits of the address of said signal to be encoded, an encode circuit of a lowest order affixed to $2^b$ outputs of a priority circuit in the lowest hierarchy and used for encoding lowest order, b, bits of said address, and (N–2) intermediate encode circuits affixed to $2^c$ outputs of a priority circuit in the intermediate hierarchy and used for encoding intermediate, C, bits of said address.

6. The priority encoder as claimed in claim 5, wherein a partial encoder is provided between said priority circuit and at least one lowest order encode circuit, (N–2) intermediate encode circuits and highest order encode circuit.

7. A priority encoder having at least one priority circuit for selecting one active input signal supplied to one input terminal at one address according to a predetermined priority order among active input signals supplied to input terminals at least at two addresses, and for producing output signals including only one active signal to be encoded corresponding to said selected active input signal, and for sequentially producing the output signals in said predetermined priority, order by selecting said active input signals one after another, and encode means for receiving said output signals including only one active signal to be encoded of said priority circuit as inputs, and for encoding the address of the input terminal which said selected active input signal is supplied to, said priority circuit is formed into a hierarchical structure having at least two hierarchies by using a plurality of small unit priority circuits which output an OR output as a logical sum signal of input signals less than said plurality of input signals, and which activate and output only an output signal corresponding no an active highest priority input signal in output signals corresponding to 1 to 1 to said input signals less than said plurality of input signals when an enable signal is active, and said OR output of the plurality of the small unit priority circuits in a lower hierarchy is the input signal to the small unit priority circuits in a higher hierarchy, and the output signals of the small unit priority circuits in the higher hierarchy are the enable signals to the plurality of small unit priority circuits in the lower hierarchy, and priority is concurrently assigned to the small unit priority circuits in the same hierarchy, and said priority circuit has a switching circuit for switching the direction of said priority order to one or an opposite direction.

8. The priority encoder as claimed in claim 7, wherein said priority circuit comprises a plurality of priority circuit elements arrays and wherein said priority circuit element array comprises signal input terminals, a first switch circuit for generating a propagation control signal toward a preceding or following priority circuit element array by means of an input signal applied to an input terminal, a second switch circuit for propagating the propagation control signal propagated from the following or preceding priority circuit element array to another preceding or following priority circuit element array, said second switch circuit being exclusively controlled by said input signal with respect to said first switch circuit, and logical arithmetic means for performing logical operations on one propagation control signal and said input signal and for outputting a result when said enable signal is activated.

9. The priority encoder as claimed in claim 8, wherein said priority circuit makes said propagation control signal an OR output, said propagation control signal being output from the priority circuit element array of a lowest or highest order.

10. The priority encoder as claimed in claim 7, wherein said priority circuit further comprises means for directly performing arithmetic operations on all of said input signals applied and outputting a result as an OR output.

11. The priority encoder as claimed in claim 7, said priority encoder having a plurality of priority circuits, each being a hierarchized small unit priority circuit with input signals less than the plurality of input signals as inputs, wherein an OR output of a small unit priority circuit in a lower hierarchy is made one input signal of a small unit priority circuit in a higher hierarchy and wherein an output signal of the priority circuit in the higher hierarchy having an address corresponding to the address of the one input signal is made an enable signal of the priority circuit in the lower hierarchy.

12. The priority encoder as claimed in claim 11, wherein said priority circuit has an N hierarchy, and wherein assuming the number of inputs in the small unit priority circuit in the highest hierarchy is $2^a$ ($a \geq 1$), the number of inputs in the small unit priority circuit in the lowest hierarchy is $2^b$ ($b \geq 1$), and the number of inputs in the small unit priority circuit in an intermediate hierarchy is $2^c$ ($c \geq 0$), said intermediate priority circuit being in the (N–2) (N≧2)) hierarchy, said encode means provided with an encode circuit of highest order affixed to $2^a$ outputs of said priority circuit in the highest hierarchy and used for encoding highest order, a, bits of the address of said encoding signal to be encoded, an encode circuit of lowest order affixed to $2^b$ outputs of said priority circuit in the lowest hierarchy and used for encoding lowest order, b, bits of said address, and (N–2) intermediate encode circuits affixed to $2^c$ outputs of said priority circuit in the intermediate hierarchy and used for encoding intermediate, C, bits of said address.

13. The priority encoder as claimed in claim 12, wherein a partial encoder is provided between said priority circuit and at least one lowest order encode circuit, (N–2) intermediate encode circuits and highest order encode circuit.

14. An encoder provided with respect to an associative memory block having a plurality of associative memory subblocks arranged with a plurality of associative memory words having continuous logical addresses, each of said associative memory words having a match detection circuit which produces a match signal when data stored in said associative memory word matches retrieval data inputted to said associative memory block, said encoder sequentially outputting the addresses of said associative memory words having said match signals, and comprising a priority main encoder for encoding the addresses of said associative memory words, and a prefetch buffer circuit built into said priority main encoder, and a priority subblock encoder for encoding the addresses of said associative memory subblocks, wherein among said match signals, the match signals in a second priority associative memory subblock are applied to said prefetch buffer circuit while said priority main encoder is encoding the addresses of said associative memory words having the match signals in a first priority associative memory subblock determined by said priority subblock encoder.

15. The encoder as claimed in claim 14, further comprising means for resetting the match signals one after another in encoding said match signals in said associative memory subblock in said priority main encoder, and means for detecting termination of encoding of said match signals in said associative memory subblock performing the encoding operation, wherein said match signals applied to said prefetch buffer circuit are encoded when the termination of the encoding operation is detected by said detection means.

* * * * *